(12) United States Patent
Kurokawa et al.

(10) Patent No.: US 6,367,061 B1
(45) Date of Patent: Apr. 2, 2002

(54) SEMICONDUCTOR INTEGRATED CIRCUIT AND MANUFACTURING METHOD THEREFOR, SEMICONDUCTOR MACRO CELL AND AUTOMATIC LAYOUT METHOD THEREFOR, AND MASK PROCESSING METHOD

(75) Inventors: Keiichi Kurokawa, Hyogo; Miwaka Takahashi, Kyoto; Minako Fukumoto; Noriko Koshita, both of Osaka; Masahiko Toyonaga, Hyogo, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/413,481

(22) Filed: Oct. 6, 1999

Related U.S. Application Data

(62) Division of application No. 08/925,437, filed on Sep. 8, 1997, now Pat. No. 6,000,829.

(30) Foreign Application Priority Data

Sep. 11, 1996 (JP) ............................................. 8-240390

(51) Int. Cl.[7] .............................................. G06F 17/50
(52) U.S. Cl. ................................ 716/10; 716/2; 716/17
(58) Field of Search ................................ 716/1, 2, 7, 8, 716/9, 10, 11, 12, 13, 14, 17

(56) References Cited

U.S. PATENT DOCUMENTS

| | | | |
|---|---|---|---|
| 4,811,237 A | * 3/1989 | Putatunda et al. | |
| 5,225,991 A | * 7/1993 | Dougherty | |
| 5,434,534 A | 7/1995 | Lucus | 327/546 |
| 5,614,815 A | 3/1997 | Yamagata et al. | 323/13 |
| 5,620,922 A | 4/1997 | Yoshida et al. | 438/210 |
| 5,783,956 A | 7/1998 | Ooishi | 324/157 |
| 5,789,972 A | 8/1998 | Lou | 324/541 |
| 5,814,980 A | 9/1998 | Lewis | 323/311 |
| 5,822,267 A | 10/1998 | Watanabe et al. | 365/227 |
| 5,886,571 A | 3/1999 | Suwabe | 327/541 |

FOREIGN PATENT DOCUMENTS

| | | |
|---|---|---|
| JP | 03-195055 | 8/1991 |
| JP | 05-055383 | 3/1993 |
| JP | 05-267460 | 10/1993 |
| JP | 06104720 | 4/1994 |
| JP | 07-029978 | 1/1995 |
| JP | 08-147341 | 6/1996 |
| JP | 08-194729 | 7/1996 |
| JP | 08-213577 | 8/1996 |

OTHER PUBLICATIONS

Notice of Reasons for Rejection mailed Jan. 18, 2000.

* cited by examiner

*Primary Examiner*—Matthew Smith
*Assistant Examiner*—Leigh Marie Garbowski
(74) *Attorney, Agent, or Firm*—McDermott, Will & Emery

(57) ABSTRACT

In a semiconductor integrated circuit, a CMOS logic circuit receives a voltage from a power-source line, while releasing a current through a ground line. A constant-voltage auxiliary circuit is disposed in parallel with the CMOS logic circuit. The constant-voltage auxiliary circuit receives an output signal from the CMOS logic circuit. The constant-voltage auxiliary circuit consumes power when the output signal from the CMOS logic circuit is stable to maintain a potential difference between the power-source line and the ground line at a specified voltage and halts power consumption when the output signal from the CMOS logic circuit is inverted, i.e., when the potential difference is decreasing, thereby suppressing the decrease of the potential difference. Accordingly, voltage fluctuations on the power-source line are suppressed.

14 Claims, 32 Drawing Sheets

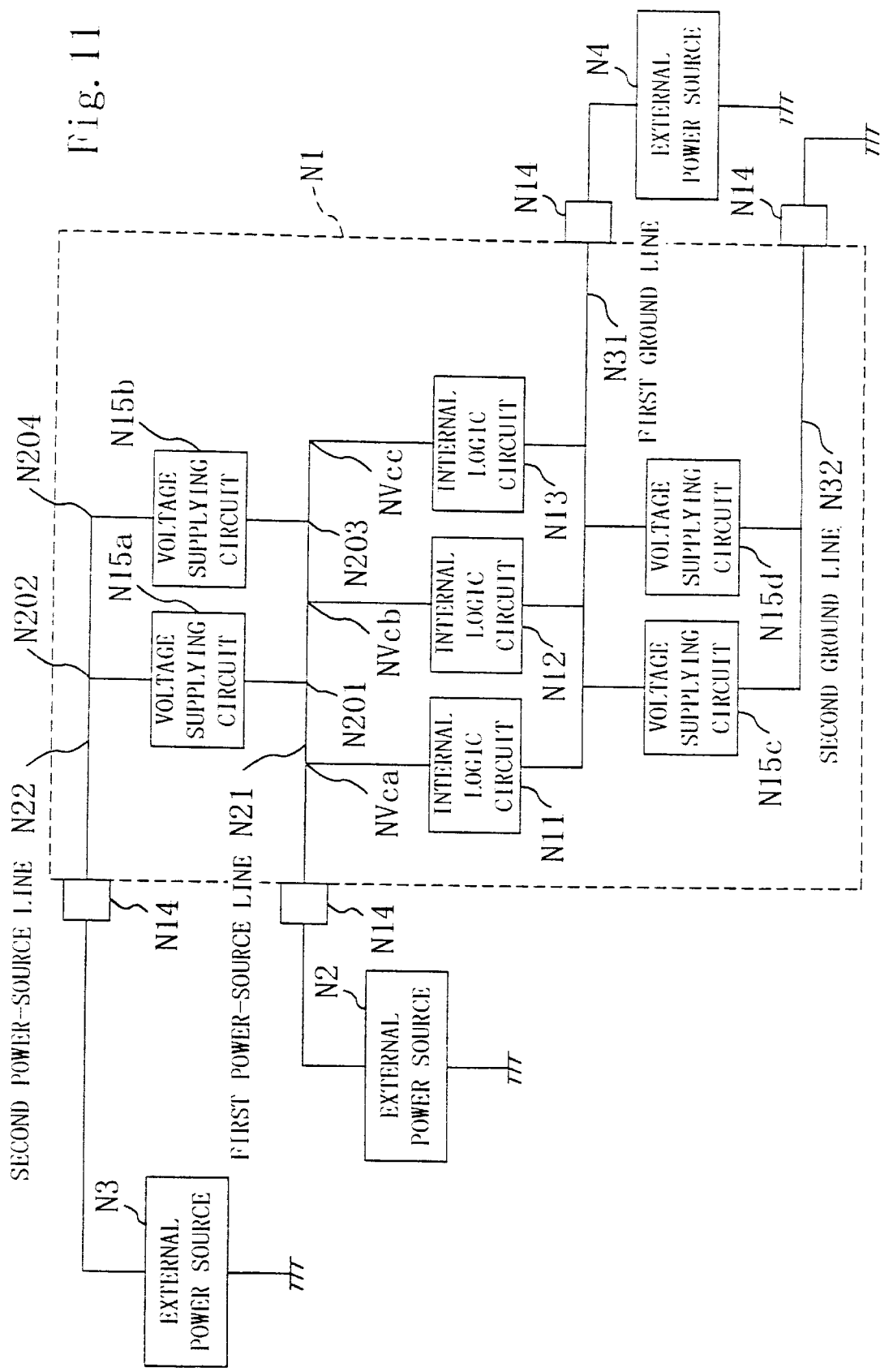

NP  P-TYPE SEMICONDUCTOR
NN  N-TYPE SEMICONDUCTOR

| | K1001 | |
|---|---|---|
| K1002 | Ka | 10 μW |
| K1002 | Kb | 9 μW |
| | Kc | 5 μW |
| | Kd | 2 μW |
| K1002 | Ke | 15 μW |
| | Kf | 1 μW |
| | ⋮ | ⋮ |

K1101

K1102 BASIC POWER-SOURCE LINE

K1101 BASIC POWER-SOURCE LINE

2

SEMICONDUCTOR INTEGRATED CIRCUIT AND MANUFACTURING METHOD THEREFOR, SEMICONDUCTOR MACRO CELL AND AUTOMATIC LAYOUT METHOD THEREFOR, AND MASK PROCESSING METHOD

This is a divisional application of Ser. No. 08/925,437, filed Sep. 8, 1997 now U.S. Pat. No. 6,000,829 issued Dec. 14, 1999.

BACKGROUND OF THE INVENTION

The present invention relates to improved semiconductor integrated circuits, particularly ones containing CMOS logic circuits. More particularly, it relates to technology for effectively suppressing fluctuations and a drop in power-source voltage to achieve a constant power-source voltage and stable high-speed operation over an extended time period.

FIG. 46 schematically illustrates the structure of a conventional semiconductor integrated circuit, in which are shown a plurality of (three in the drawing) semiconductor integrated circuits 1 based on CMOS logic. Each of the semiconductor integrated circuits is composed of a logic input circuit 11, an internal logic circuit 12, and a logic output circuit 13, which are integrally formed on a single semiconductor substrate. External terminals 14 are for achieving external connection. The three semiconductor integrated circuits 1 are mounted on the same printed circuit board 2 and operated with a power-source voltage Vc2l, which is from an external power source 3 and distributed to each of the semiconductor integrated circuits 1 through a common constant-voltage circuit 4 and a power-source line 21.

The constant-voltage circuit 4 is composed of a constant-voltage circuit T41 using a row of diodes and an output MOS transistor T42.

The conventional semiconductor integrated circuit has the following problem.

As shown in FIG. 46, a considerable amount of parasitic resistance Rs and inductance Ls is produced on the power-source line 21 between the constant-voltage circuit 4 and each of the semiconductor integrated circuits 1. Consequently, even though the output voltage Vc2l from the constant-voltage circuit 4 is held constant as shown in FIG. 47, a power-source voltage Vc22 actually supplied to each of the semiconductor integrated circuits 1 may fluctuate due to a voltage drop on the power-source line 21, the superimposition of external noise N, or the like and is not necessarily constant.

As a result, each of the semiconductor integrated circuits 1 becomes susceptible to a misoperation resulting from the fluctuations of the operating power-source voltage Vc22. In particular, a semiconductor integrated circuit using a voltage (e.g., 3 V) lower than a normal voltage value (5 V) has been employed in a contemporary electronic circuit device and associated equipment having a battery as a power source. Since the semiconductor integrated circuit operating at such a low power-source voltage is highly sensitive to fluctuations in power-source voltage, a misoperation is caused by only slight voltage fluctuations resulting from the parasitic resistance Rs or inductance Ls on the power-source line 21.

The power-source voltage may also fluctuate depending on the operation of the internal circuit of the semiconductor integrated circuit 1. Voltage fluctuations may cause RF noise and exert a greater influence on the internal circuit thereof than exerted by a voltage drop, resulting in a misoperation.

Thus, the conventional semiconductor integrated circuit has the problem of high susceptibility to a misoperation resulting from voltage fluctuations on the power-source line, from the superimposed noise, or from the operation of the internal circuit thereof.

To solve the problem, Japanese Laid-Open Patent Publication HEI 6-104720 has proposed a structure having an internal constant-voltage circuit provided therein. However, the structure with the internal constant-voltage circuit increases an area occupied by an LSI and has not given sufficient consideration to the influence of a voltage drop accompanying the provision of the additional constant-voltage circuit.

In general, the semiconductor integrated circuit as shown in FIG. 46 is designed to be operable even when the power-source voltage Vc20 from the external power source 3 fluctuates to some extent. Because allowance has thus been made for the fluctuation of the power-source voltage Vc20, the performance of the semiconductor integrated circuit should be underestimated accordingly. Hence, the semiconductor integrated circuit cannot be designed to deliver performance only under optimum conditions, which presents another problem.

SUMMARY OF THE INVENTION

It is therefore an object of the present invention to provide a semiconductor integrated circuit less susceptible to a misoperation resulting from the fluctuation of the voltage on a power-source line or. from the superimposed noise.

To attain the above object, the present invention has adopted the following structures, which will be described briefly:

(1) A constantly operating circuit is provided in the semiconductor integrated circuit to suppress voltage fluctuations.

(2) Voltages from two power sources are supplied to the internal circuit of the semiconductor integrated circuit to suppress a voltage drop.

(3) A capacitor element and a power-source monitor line are provided for the internal circuit of the semiconductor integrated circuit so that charges are supplied from the capacitor element to the internal circuit when the power-source monitor line detects a voltage drop in the internal circuit, thereby suppressing a voltage drop.

(4) A redundant power-source line is provided in mask design for the semiconductor integrated circuit to suppress a voltage drop.

Specifically, a semiconductor integrated circuit according to the present invention comprises: a power-source line and a ground line; a logic circuit portion composing a logic circuit and connected to the power-source line and ground line; and a constant-voltage auxiliary circuit connected, in parallel with the logic circuit portion, to the power-source line and ground line, the constant-voltage auxiliary circuit consuming power by causing a current to flow from the power-source line to the ground line in a stable state in which an output value from the logic circuit portion does not vary and halting the power consumption when the output value from the logic circuit portion varies.

Alternatively, the semiconductor integrated circuit according to the present invention comprises: a plurality of logic circuits; a first power-source line connected to each of the logic circuits and carrying a specified power-source voltage; a second power-source line different from the first power-source line; and a voltage supplying circuit connected to the first and second power-source lines, the voltage supplying circuit detecting a variation in any of voltages supplied from the first power-source line to the logic circuits from the value of the specified power-source voltage to another value and supplying, upon detection, a voltage from the second power-source line to the first power-source line.

Alternatively, the semiconductor integrated circuit according to the present invention comprises: an internal semiconductor circuit; a power source connected to the internal semiconductor circuit; a first power-source monitor line for monitoring a level of a power-source voltage supplied from the power source to the internal semiconductor circuit; a second power-source monitor line for monitoring a level of the power-source voltage inside the internal semiconductor circuit when the internal semiconductor circuit is in operation; and a level-fluctuation compensator connected to the first and second power-source monitor lines, the level-fluctuation compensator detecting fluctuations in the level of the. internal power-source voltage when the internal semiconductor circuit is in operation and adjusting, upon detection of fluctuations in the level of the operating voltage, the power-source voltage inside the internal semiconductor circuit to be equal in level to the power-source voltage from the power source.

An automatic layout method for a plurality of semiconductor macro cells according to the present invention involves the use of a computer and comprises a clustering step of placing the plurality of macro cells comprising: a high-power-cell retrieving step of retrieving, from the plurality of macro cells, ones each consuming high power; and a pairing step of adding a charge-accumulating cell to each of the high-power-consumption macro cells retrieved in the retrieving step to pair each of the high-power-consumption macro cells with one charge-accumulating cell.

Alternatively, the automatic layout method for a plurality of semiconductor macro cells according to the present invention involves the use of a computer and comprises a macro-cell placing step of placing the plurality of macro cells comprising: a high-power-cell retrieving step of retrieving, from the plurality of macro cells, ones each consuming high power; and a placement step of placing the plurality of high-power-consumption macro cells retrieved in the high-power-cell retrieving step such that a maximum allowable spacing is provided between the individual high-power-consumption macro cells.

Alternatively, the automatic layout method for a plurality of semiconductor macro cells according to the present invention involves the use of a computer and comprises a macro-cell placing step of placing the plurality of macro cells comprising: a high-power-cell retrieving step of retrieving, from the plurality of macro cells, ones each consuming high power; a position specifying step of specifying a position at which a basic power-source line is to be placed; a placement step of placing each of the plurality of high-power-consumption macro cells retrieved in the high-power-cell retrieving step at a reduced distance from the basic power-source line the position of which has been specified in the position specifying step.

Alternatively, the automatic layout method for a plurality of semiconductor macro cells according to the present invention involves the use of a computer and comprises a macro-cell placing step of placing the plurality of macro cells comprising: a high-power-cell retrieving step of retrieving, from the plurality of macro cells, ones each consuming high power; a position specifying step of specifying a position at which a basic power-source line is to be placed; a power-source-terminal-point retrieving step of retrieving a point of a power-source terminal of each of the high-power-consumption macro cells; a connecting-point retrieving step of retrieving such a connecting point on the basic power-source line as to minimize a distance between the point of the power-source terminal of the high-power-consumption macro cell and the basic power-source line; and a power-source-auxiliary-line routing step of wiring the point of the power-source terminal of the high-power-consumption macro cell to the connecting point on the basic power-source line with a power-source auxiliary line.

Alternatively, the automatic layout method for a plurality of semiconductor macro cells according to the present invention involves the use of a computer and comprises a macro-cell placing step of placing the plurality of macro cells comprising: a high-power-cell retrieving step of retrieving, from the plurality of macro cells, ones each consuming high power; and a power-source-auxiliary-line routing step of wiring an in-cell power-source line supplying power to any of the high-power-consumption macro cells retrieved in the high-power-cell retrieving step and another in-cell power-source line not supplying power to the high-power-consumption macro cells with a power-source auxiliary line.

A mask processing method for a semiconductor macro cell according to the present invention comprises a mask processing step for the semiconductor macro cell using a computer comprising: a power-source-line-configuration retrieving step of retrieving a power-source-line configuration from an entire region occupied by the cell; an inverted-geometry generating step of generating an inverted geometry corresponding to the entire region occupied by the cell except for power-source lines and wiring in a wiring layer containing the power-source lines; a dividing step of dividing the generated inverted geometry into a plurality of geometries; a mask operation step of adding the post-division inverted geometries to the retrieved power-source-line configuration; and a power-source-line reducing step of reducing the power-source-line configuration including the additional post-division inverted geometries by the magnitude of a specified minimum wire spacing.

A semiconductor macro cell according to the present invention comprises a wiring layer containing power-source lines, wherein the power-source lines and wiring other than the power-source lines are disposed in the. wiring layer, the power-source lines being placed over an entire region at a distance equivalent to a specified minimum wire spacing from the wiring.

Thus, according to the present invention, the constant-voltage auxiliary circuit consumes power when the output from the logic circuit portion is stable, i.e., when the power-source voltage is stable, so that the power-source voltage is held constant at a given value. On the other hand, the constant-voltage auxiliary circuit halts power consumption when the output from the logic circuit portion is inverted, i.e., when the logic circuit power consumes power to cause the fluctuation of the power-source voltage, so that the power-source voltage is also held constant at the given value.

When a voltage is supplied from the first power-source line to the internal logic circuit of the semiconductor integrated circuit and the internal logic circuit operates to consume power and cause voltage fluctuations, the voltage supplying circuit operates to cause the second power-source line to supply power to the first power-source line, so that voltage fluctuations are effectively suppressed.

Moreover, when the internal power-source voltage is lowered in level or the ground voltage is increased in level during the operation of the internal semiconductor circuit, the level-fluctuation compensator operates to cause the charge accumulator to supply charges to the internal semiconductor circuit or the charge releaser to extract charges from the internal semiconductor circuit, so that fluctuations in voltage level in the internal semiconductor circuit is suppressed.

Furthermore, since the present invention has added the respective charge-accumulating cells to the plurality of macro cells each consuming high power, placed each of the high-power-consumption macro cells in the vicinity of the basic power-source line, connected the high-power-consumption macro cell to the basic power-source line with the auxiliary power-source line, or connected the power-source line of a macro cell consuming only a small amount of power to the high-power-consumption macro cell with the auxiliary power-source line in mask design of the semiconductor integrated circuit, a drop in voltage supplied to the high-power-consumption macro cell can be minimized.

Additionally, since the semiconductor macro cell according to the present invention has a power-source line having a maximum allowable thickness, the power-source line itself functions as a capacitor to stabilize a power supply to the semiconductor macro cell.

BRIEF DESCRIPTION OF THE DRAWINGS

The accompanying drawings illustrate the preferred embodiments of the present invention.

In the drawings:

FIG. 11 is a circuit diagram showing the structure of a semiconductor integrated circuit according to a second embodiment of the present invention;

DETAILED DESCRIPTION OF THE INVENTION

Figure 1:
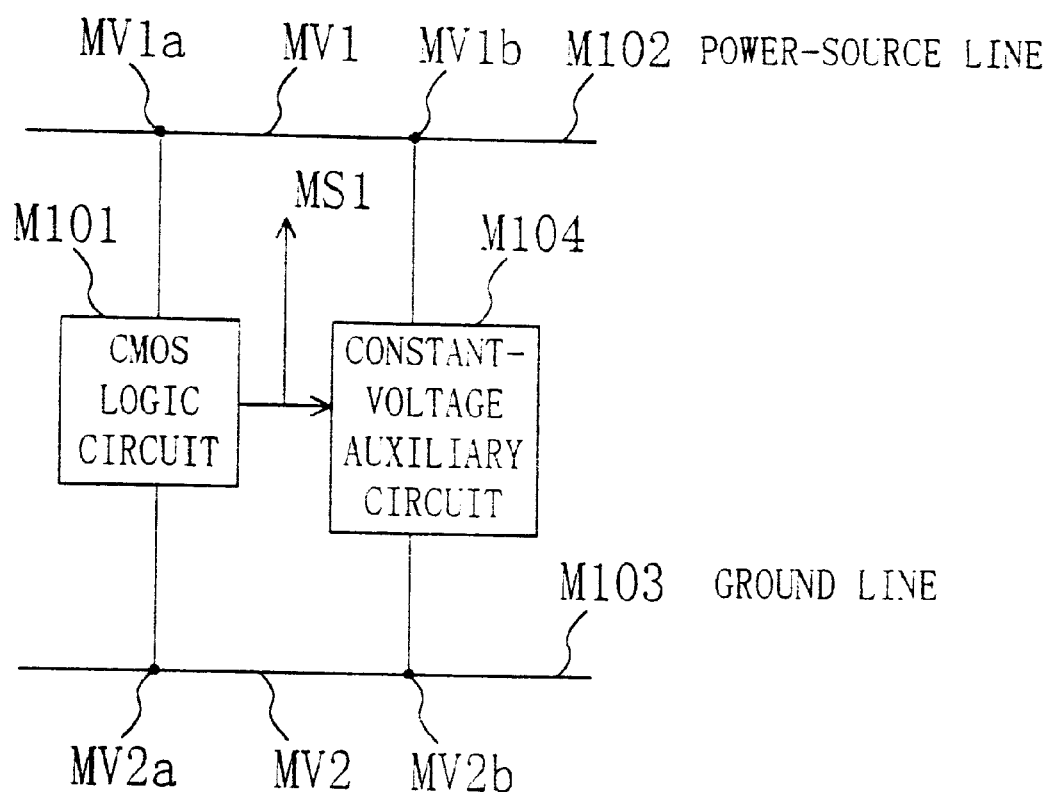
FIG. 1 diagrammatically shows a semiconductor integrated circuit according a first embodiment of the present invention.

Referring now to the drawings, preferred embodiments of the present invention will be described.

First Embodiment

A first embodiment of the present invention will be described. FIG. 1 shows a semiconductor integrated circuit according to the present embodiment, in which a CMOS logic circuit (logic circuit portion) M101 receives a voltage from a power-source line M102 and emits a current through a ground line 103. The drawing of a logic input of the CMOS logic circuit M101 is omitted here. In parallel with the CMOS logic circuit M101, there is placed a constant-voltage auxiliary circuit M104 which receives an output signal MS1 from the CMOS logic circuit M101.

Figure 2A:
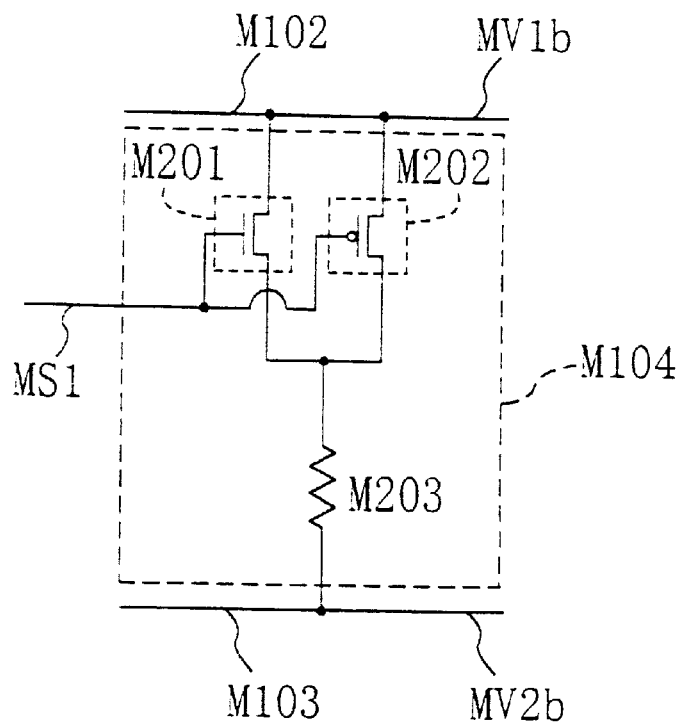
FIG. 2(a) shows a specific structure of a constant-voltage auxiliary circuit in the semiconductor integrated circuit and FIG. 2(b) shows a variation of the constant-voltage auxiliary circuit.
Figure 2B:
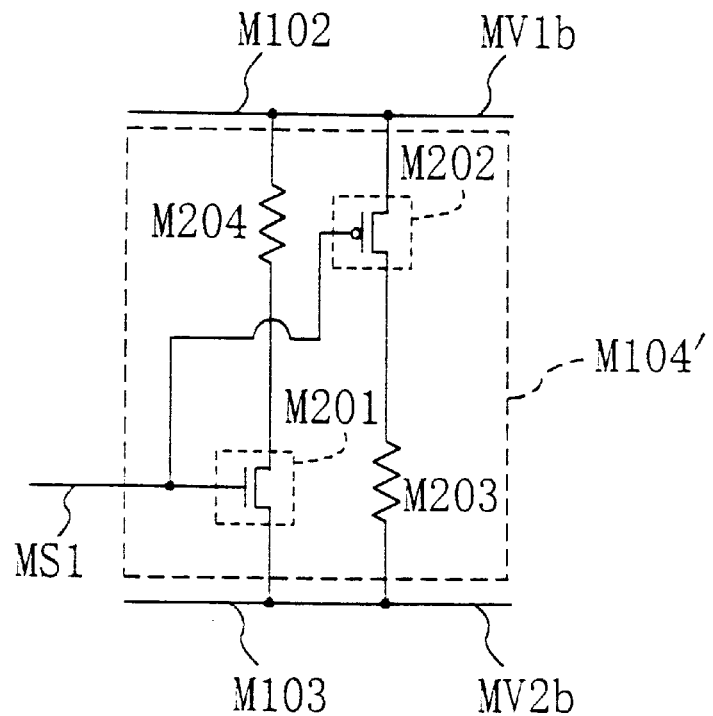

FIGS. 2 show specific structures of the constant-voltage auxiliary circuit M104. As shown in FIG. 2(a), a parallel circuit composed of an NMOS transistor M201 and a PMOS transistor M202 having different voltage characteristics is connected to a resistor M203, which is connected to a ground line M103 so as to connect the parallel circuit to a power-source line M102. Each of the two transistors M201 and M202 composing the parallel circuit receives the output signal MS1 from the CMOS logic circuit M101 at its gate. When the signal MS1 is HIGH, the NMOS transistor M201 is closed, while the PMOS transistor M202 is opened. In place of the constant-voltage auxiliary circuit M104, it is also possible to use another constant-voltage auxiliary circuit M104' as shown in FIG. 2(b), in which a series circuit composed of an NMOS transistor M201 and a resistor M204 and a series circuit composed of an NMOS transistor M202 and a resistor M203 are connected to the power-source line M102 and to the ground line M103.

In the constant-voltage auxiliary circuit M104 or M104', the respective threshold voltages Vtn and Vtp of the NMOS and PMOS transistors M201 and M202 and a voltage MV1b at a connecting point between the power-source line M102 and the constant-voltage auxiliary circuit M104 have a relationship represented by the following numerical expression:

$$MV1b-Vtp<Vtn$$

From the foregoing numerical expression, it will be understood that, when the output signal MS1 from the CMOS logic circuit M101 shifts from the LOW level to the HIGH level or vice versa, one of the transistors M201 and M202 in the constant-voltage auxiliary circuit M104 or M104' that is closed is opened to place both of the transistors in the open state and, after a specified time elapsed, the other of the transistors M202 and M201 is closed.

A description will be given to the operation of the semiconductor integrated circuit according to the present embodiment.

Figure 4:
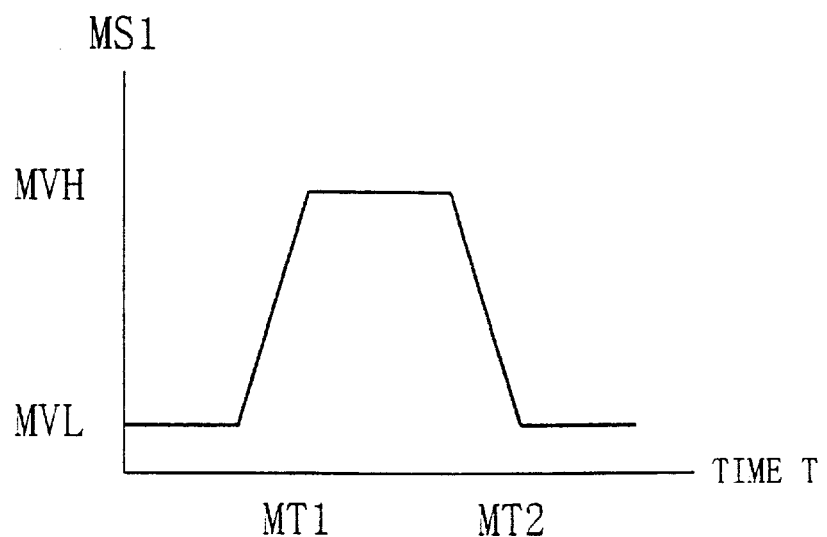
FIG. 4 shows the time-varying value of an output signal from a CMOS logic circuit.

The output signal MS1 from the CMOS logic circuit M101 shifts to the HIGH level MVH or to the LOW level MVL responsive to the value of an input signal. Here, a description will be given to the case where the output signal MS1 varies with time T as shown in FIG. 4. Specifically, the output signal MS1 shifts from the LOW level MVL to the HIGH level MVH at a time MT1 and shifts from the HIGH level MVH to the LOW level MVL at a time MT2.

Figure 5:
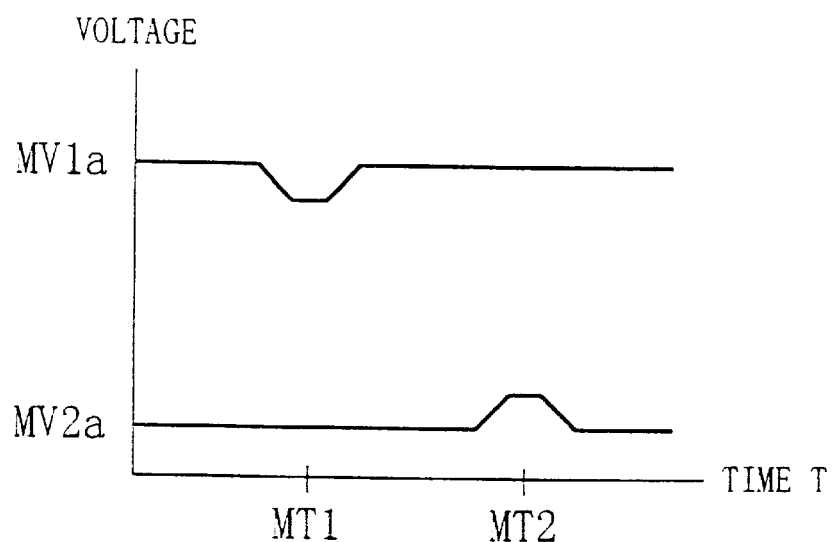
FIG. 5 shows the power-source and ground potentials of a conventional CMOS logic circuit, each varying with time.
Figure 10:
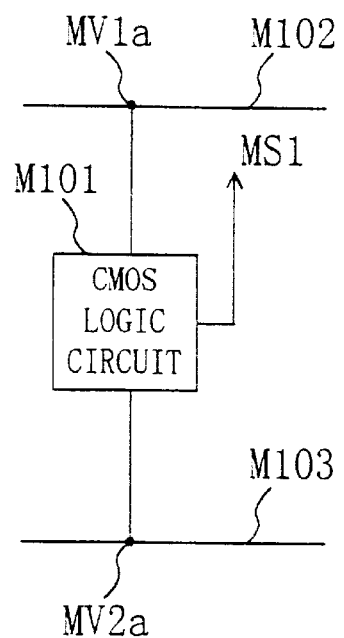
FIG. 10 diagrammatically shows the conventional CMOS logic circuit.

In response to the variation of the output signal MS1, charges are accumulated in and released from the CMOS logic circuit M101 around the times MT1 and MT2 at which the output signal MS1 shifts. Upon the accumulation and release of the charges, a voltage MV1a at the connecting point between the power-source line M102 and the CMOS logic circuit M101 drops, while a voltage MV2b at the connecting point between the ground line M103 and the CMOS logic circuit M101 rises. The voltages MV1a and MV2b at the respective connecting points in the conventional semiconductor integrated circuit composed only of the CMOS logic circuit M101 shown in FIG. 10 vary as illustrated in FIG. 5.

Figure 6:
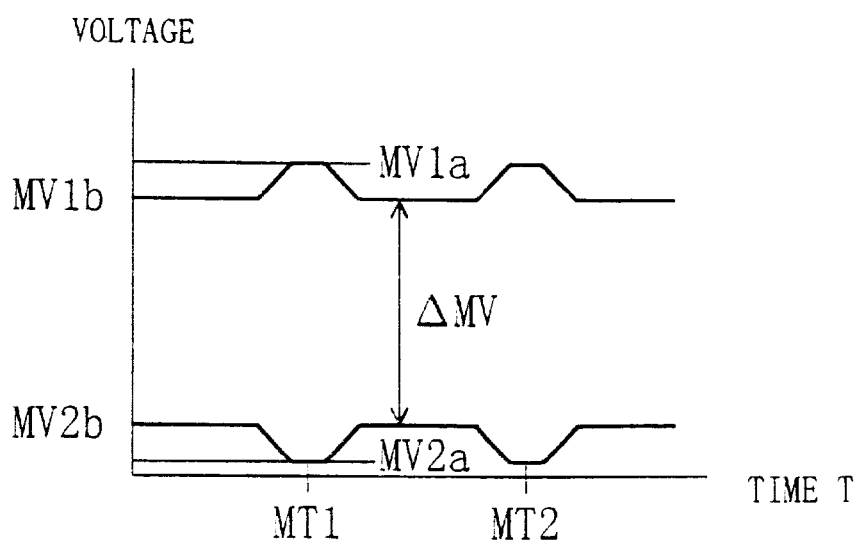
FIG. 6 shows the power-source and ground potentials of the constant-voltage auxiliary circuit according to the first embodiment, each varying with time.

By contrast, the voltages MV1a and MV2b vary as illustrated in FIG. 6 in the constant-voltage auxiliary circuit M104 according to the present embodiment shown in FIG. 2 in response to the output signal MS1 from the CMOS logic circuit M101.

Specifically, when the output signal MS1 is on the LOW level MVL, one transistor M201 of the constant-voltage auxiliary circuit M104 is opened, while the other transistor M202 thereof is closed, so that a steady-state current flows through the transistor M202 in the closed state and through the resistor 203. Consequently, the voltage MV1b at the connecting point between the constant-voltage auxiliary circuit M104 and the power-source line M102 drops by a specified value, while the voltage MV2b at the connecting point between the constant-voltage auxiliary circuit M104 and the ground line M103 rises by a specified value, resulting in a stable potential difference between the voltages MV1b and MV2b at the respective connecting points.

At the time MT1 at which the output signal MS1 shifts from the LOW level MVL to the HIGH level MVH, the transistor M202 opens with the increasing voltage of the signal MS1, so that the steady-state current is temporarily prevented from flowing in the constant-voltage auxiliary circuit M104. Accordingly, the voltage drop and voltage rise due to the steady-state current are not observed and hence the potential difference between the voltages MV1b and MV2b at the respective connecting points is temporarily increased. When the value of the output signal MS1 approaches the HIGH level MVH, one transistor M201 is closed and the steady-state current flows again through the transistor M201 and the resistor M203, so that the potential difference between the voltages MV1b and MV2b at the respective connecting points is stabilized again at a give value.

Likewise, one transistor M201 is also opened with the decreasing voltage of the signal MS1 at the time MT2 at which the output signal MS1 shifts from the HIGH level MVH to the LOW level MVL, so that the steady-state current is temporarily prevented from flowing in the constant-voltage auxiliary circuit M104 and hence the potential difference between the voltages MV1b and MV2b at the respective connecting points is temporarily increased. However, when the value of the signal MS1 approaches the low level MVL, the other transistor M202 is closed and the steady-state current flows again through the transistor M202 and the resistor M203 so that the potential difference between the voltages MV1b and MV2b at the respective connecting points is stabilized at a given value.

Figure 7:
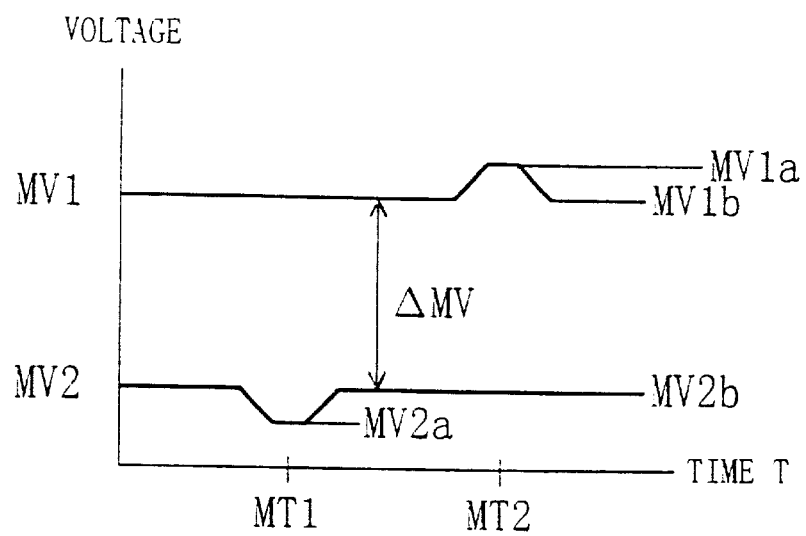
FIG. 7 shows the power-source and ground potentials of the semiconductor integrated circuit according to the first embodiment, each varying with time.

Thus, as shown in FIG. 7, the operation of the constant-voltage auxiliary circuit M104 according to the present embodiment guarantees a specified voltage of ΔMV or more for the potential difference between the voltages MV1 and MV2 at the respective connecting points to the power-source line M102 and ground line M103 of the semiconductor integrated circuit shown in FIG. 1. As a result, a misoperation in the CMOS logic circuit M101 resulting from a reduced potential difference can be prevented.

Although the constant-voltage auxiliary circuit M104 operates during the halts of the CMOS logic circuit M101 and power consumption increases accordingly, if the operating frequency of an LSI increases in the future to reach a value of several GHz or more, the LSI will be operating constantly, so that the increase in power consumption caused by the operation of the constant-voltage auxiliary circuit M104 becomes negligible and the achievement of a constant voltage exerts a remarkable effect.

Variation of Constant-Voltage Auxiliary Circuit

Figure 3:
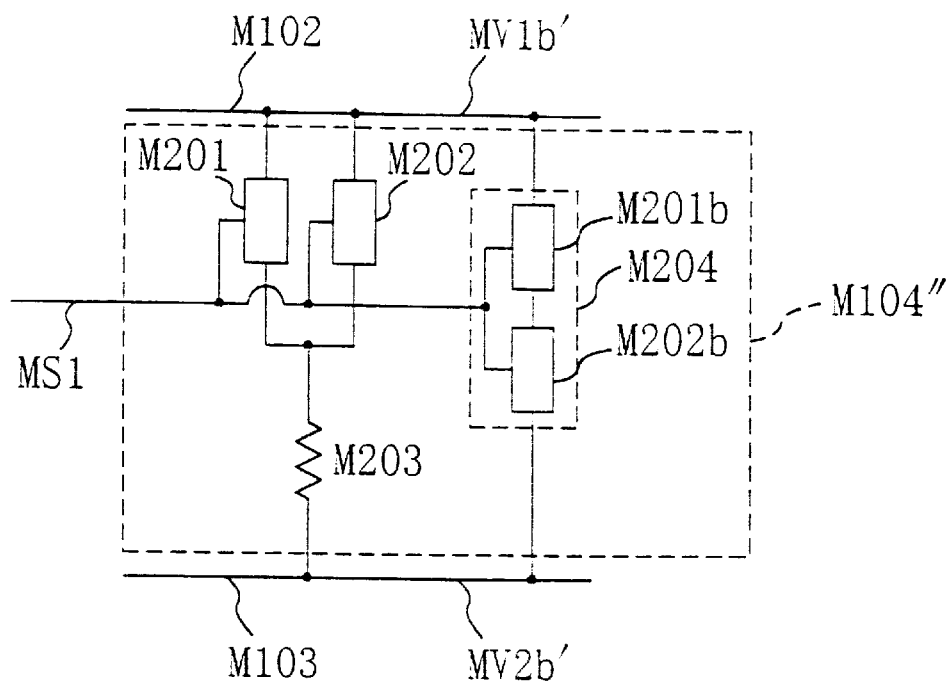
FIG. 3 shows another variation of the constant-voltage auxiliary circuit.

FIG. 3 shows a variation of the constant-voltage auxiliary circuit M104.

The constant-voltage auxiliary circuit M104" shown in FIG. 3 is implemented by adding, to the structure of the constant-voltage auxiliary circuit M104 shown in FIG. 2, a CMOS inverter circuit M204 consisting of a transistor M201b which is closed when the output signal from the CMOS logic circuit M101 (input signal to the gate) is HIGH and a transistor M202b which is opened when the output signal (input gate signal) MS1 is HIGH. The transistors M201b and M202b are arranged in series. The CMOS inverter circuit M204 is connected to the power-source line M102 and to the ground line M103.

Figure 8:
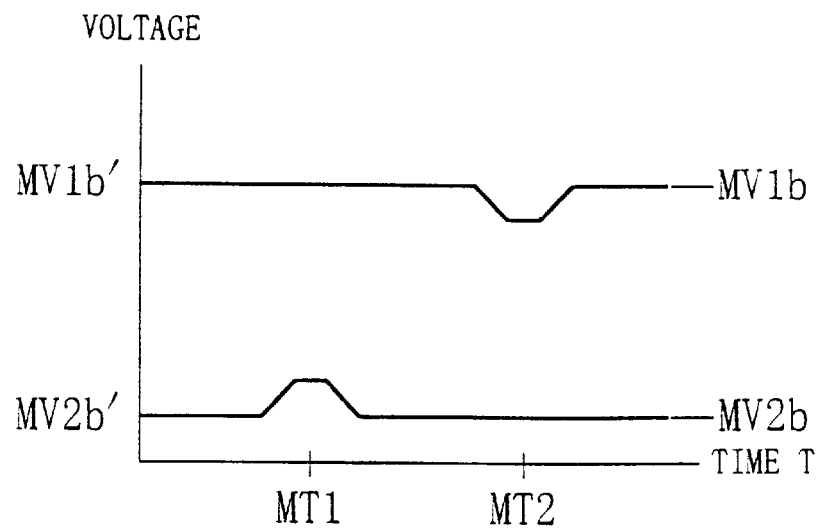
FIG. 8 shows the power-source and ground potentials of a variation of the constant-voltage auxiliary circuit, each varying with time.

In the present variation, voltages MV1b' and MV2b' at the respective connecting points to the power-source line M102 and ground line M103 of the CMOS inverter circuit M204 exhibit the characteristics as shown in FIG. 8 in response to the output signal MS1 varying as shown in FIG. 4.

Figure 9:
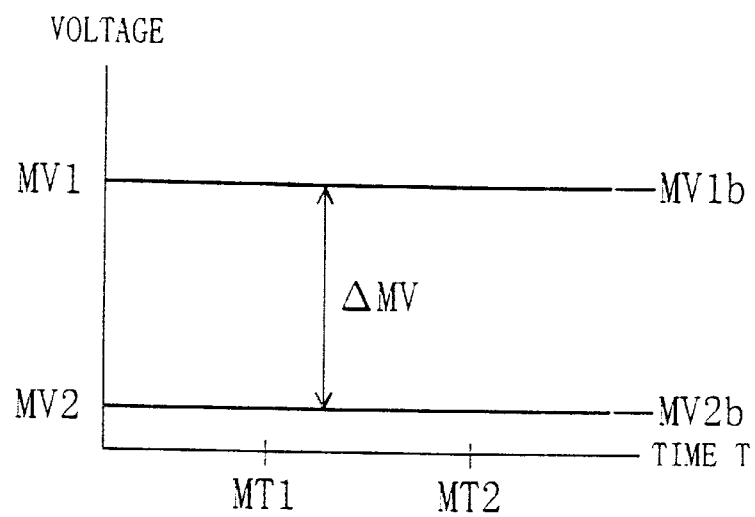
FIG. 9 shows the power-source and ground potentials of a semiconductor integrated circuit having the variation of the constant-voltage auxiliary circuit, each varying with time.

Thus, in the present variation, the potential difference between the voltages MV1 and MV2 at the respective connecting points to the power-source line M102 and ground lines M103 of the semiconductor integrated circuit shown in FIG. 1 is completely stabilized at a specified voltage ΔMV, as shown in FIG. 9. Accordingly, a misoperation in the CMOS logic circuit M101 caused by a reduced potential difference can be prevented more positively.

As described above, the potential difference between the power source and the ground can be held constant in the semiconductor integrated circuit in which the constant-voltage auxiliary circuit M104, M104', or M104" is disposed adjacent to the CMOS logic circuit M101, which prevents a misoperation in the CMOS logic circuit due to a reduction or variation in potential difference.

It will be appreciated that the present invention is not limited to the structure of the constant-voltage auxiliary circuit M104, M104' or M104" used in the present embodiment. Similar effects can be achieved by the structure partially modified in which the transistor or resistor is placed differently.

Second Embodiment

FIG. 11 shows a semiconductor integrated circuit according to a second embodiment of the present invention.

A semiconductor integrated circuit N1 shown in the drawing is a CMOS logic circuit having; three internal logic circuits (logic circuits) N11, N12, and N13; four voltage supplying circuits N15a, N15b, Nl5c, and N15d; two power-source lines N21 and N22; and two ground lines N31 and N32, which are integrally formed on a single semiconductor substrate. In the drawing are also shown: an input/output circuit N14 for the semiconductor integrated circuit N1 and external power sources N2, N3, and N4. Each of the internal logic circuits N11 to N13 is composed of a single or a plurality of logic gates.

One power-source line N21 (first power-source line) supplies a power-source voltage from the external power source N2 directly to each of the internal logic circuits N11, N12, and N13. The other power-source line N22 (second power-source line) supplies a power-source voltage from the external power source N3 to the power-source line N21 through the voltage supplying circuits N15a and N15b. The potential difference between the two external power sources N2 and N3 is set at a voltage (e,g., 0.8 v) equal to or more than the potential difference with which the voltage supplying circuits (specifically, diode circuits which will be described later) N15a and N15b are turned ON.

One ground line (first ground line) N31 supplies a power-source voltage from the external power source N4 to each of the internal logic circuits N11, N12, and N13. The other ground line (second ground line) N32 is connected to the ground and to the first ground line N31 via the voltage supplying circuits N15c and Nl5d. When a voltage on the ground line N31 is increased, a current is allowed to flow from the ground line N31 through the voltage supplying circuits N15c and N15d, thereby lowering the voltage on the ground line N31. The power-source voltage from the external power source N4 is set at a value (e.g., 0.8 v) equal to or more than a potential difference with which the voltage supplying circuits (diode circuits which will be described later) N15c and Nl5d are turned ON.

Figure 12A:
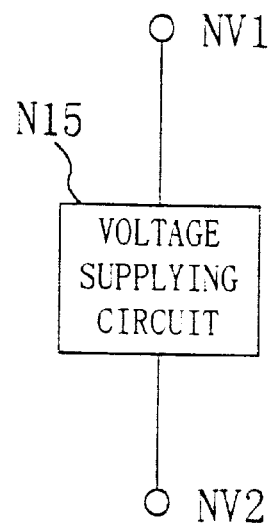
FIG. 12(a) shows a voltage supplying circuit and FIG. 12(b) shows the characteristics of the voltage supplying circuit shown in FIG. 12(a)
Figure 12B:
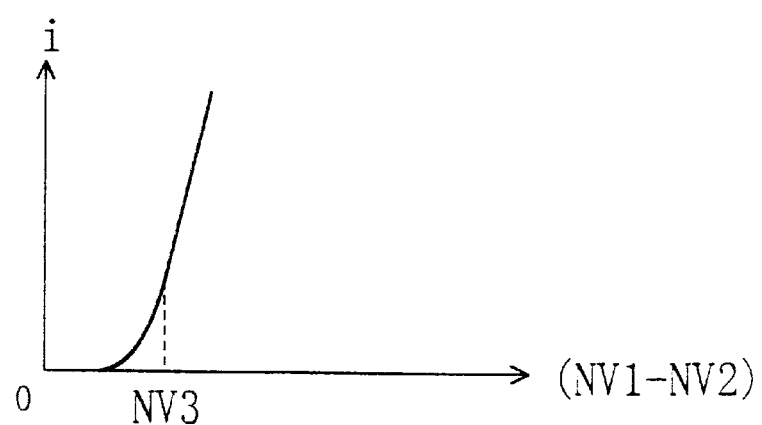

As shown in FIG. 12(a), each of the voltage supplying circuits N15a to N15d is characterized in that, if the potential difference (NV1–NV2) between specified voltages NV1 and NV2 assumedly applied to the both ends of each of the voltage supplying circuits N15a to N15d exceeds a given value NV3, a current is allowed to flow from the higher voltage NV1 to the lower voltage NV2, as shown in FIG. 12(b).

Figure 13A:
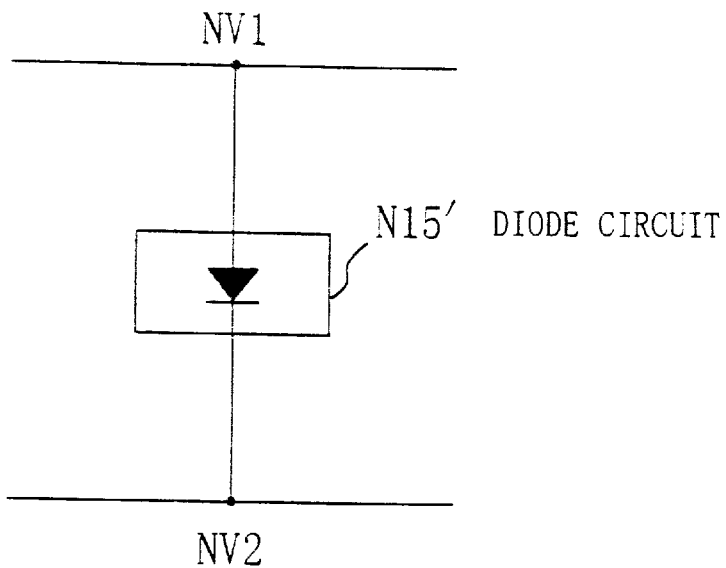
FIG. 13(a) shows another specific example of the voltage supplying circuit and FIG. 13(b) shows the characteristics of the voltage supplying circuit shown in FIG. 13(a)
Figure 13B:
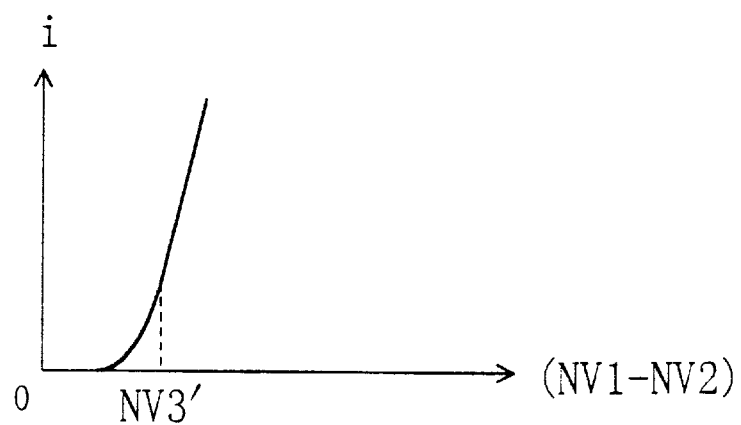
Figure 14A:
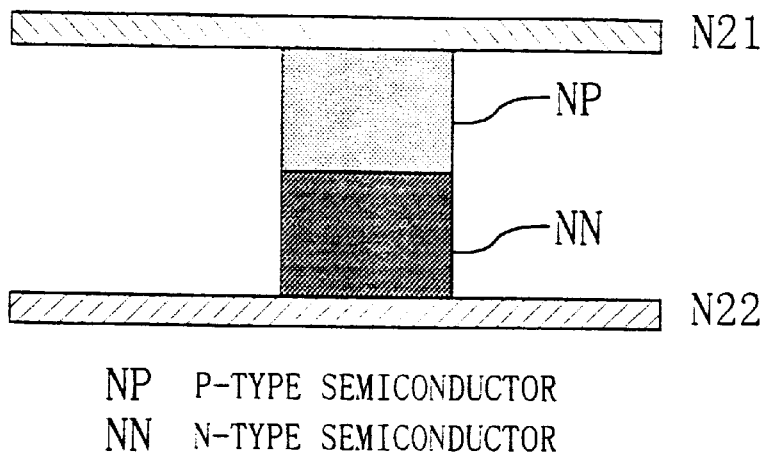
FIG. 14(a) shows the layout of a voltage supplying circuit composed of a diode circuit.
Figure 14B:
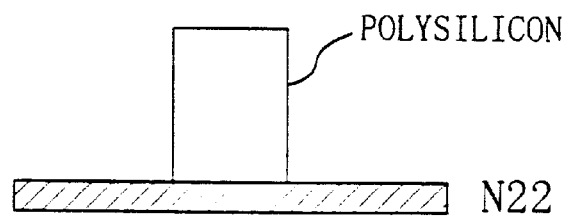
FIG. 14(b) illustrates a first step of forming the diode circuit.
Figure 14C:
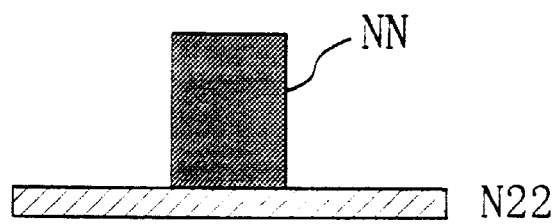
FIG. 14(c) illustrates a second step of forming the diode circuit.
Figure 14D:
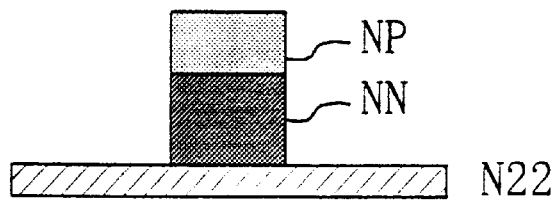
FIG. 14(d) illustrates a third step of forming the diode circuit.
Figure 14E:
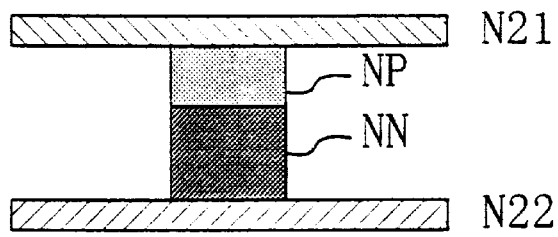
FIG. 14(e) illustrates a fourth step of forming the diode circuit.

As shown in FIG. 13(a), each of the voltage supplying circuits N15a to 15d is composed of a diode circuit N15'. As shown in FIG. 13(b), the diode circuit N15' is characterized in that it allows a current to flow at a voltage equal to or higher than an operating voltage NV3', similarly to the case shown in FIG. 12(b). If the diode circuit N15' on the power-source side is used as an example, it can be implemented by the structure shown in FIG. 14(a), which is formed in accordance with the following method. As shown in FIG. 14(b), a contact via is provided between the first wiring layer for the power-source line N21 and the second wiring layer for the power-source line N22, into which polysilicon is injected. Subsequently, an impurity composed of an element in Group 5 are diffused as shown in FIG. 14(c), followed by an impurity composed of an element in Group 3 diffused as shown in FIG. 14(d), resulting in the connection between the power-source lines N21 and N22 as shown in FIG. 14(e).

A description will be given to the operation of the semiconductor integrated circuit according to the present embodiment.

Figure 17:
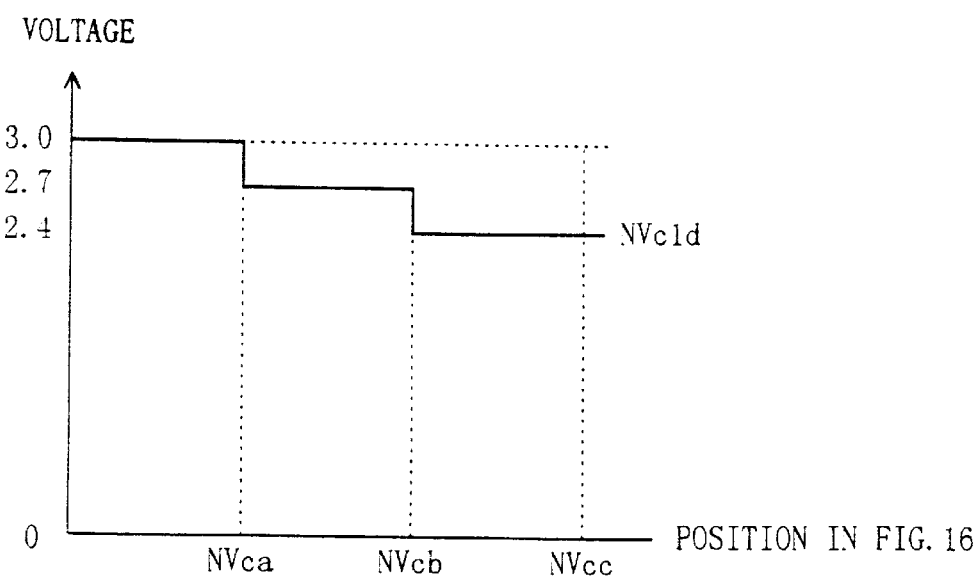
FIG. 17 shows a power-source voltage supplied to each internal circuit of the conventional semiconductor integrated circuit.

Conventionally, a voltage has been supplied from the power-source or ground directly to the internal logic circuits N11, N12, and N13. If attention is given to the voltage on the power-source line N21, e.g., and the operation of the internal logic circuit N11 is assumed to cause a voltage drop of 0.3 V, a power-source voltage supplied to the internal logic circuit N12 becomes 2.7 V. The voltage drop is indicated by the segment between "0" and "NVcb" of the solid line in FIG. 17. Then, if the operation of the internal logic circuit N12 is assumed to cause a voltage drop of 0.3 V on the power-source line, a power-source voltage supplied to the internal logic circuit N13 becomes 2.4 V. The voltage drop is indicated by the segment between "NVcb" and "NVcc" of the solid line in FIG. 17. If the operating voltage for the internal logic circuit N13 is 2.5 V, therefore, a misoperation may occur in the internal logic circuit N13.

Figure 15:
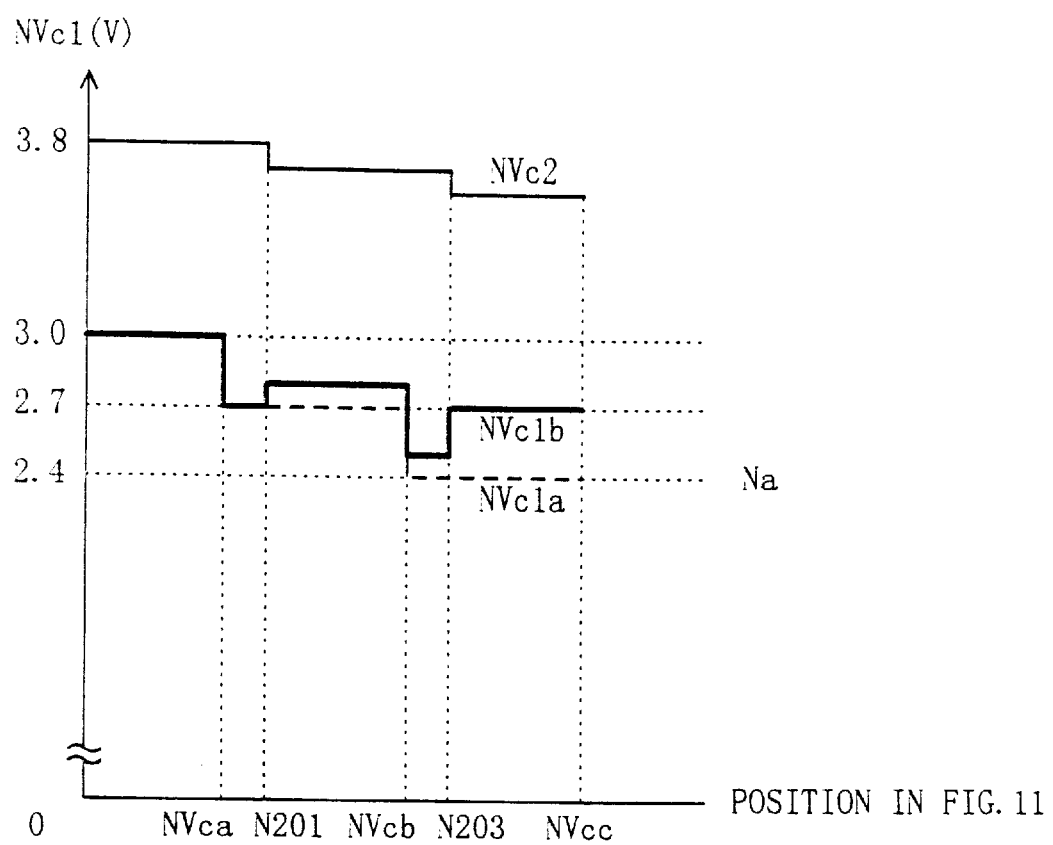
FIG. 15 illustrates the operation of the semiconductor integrated circuit according to the second embodiment.
Figure 16:
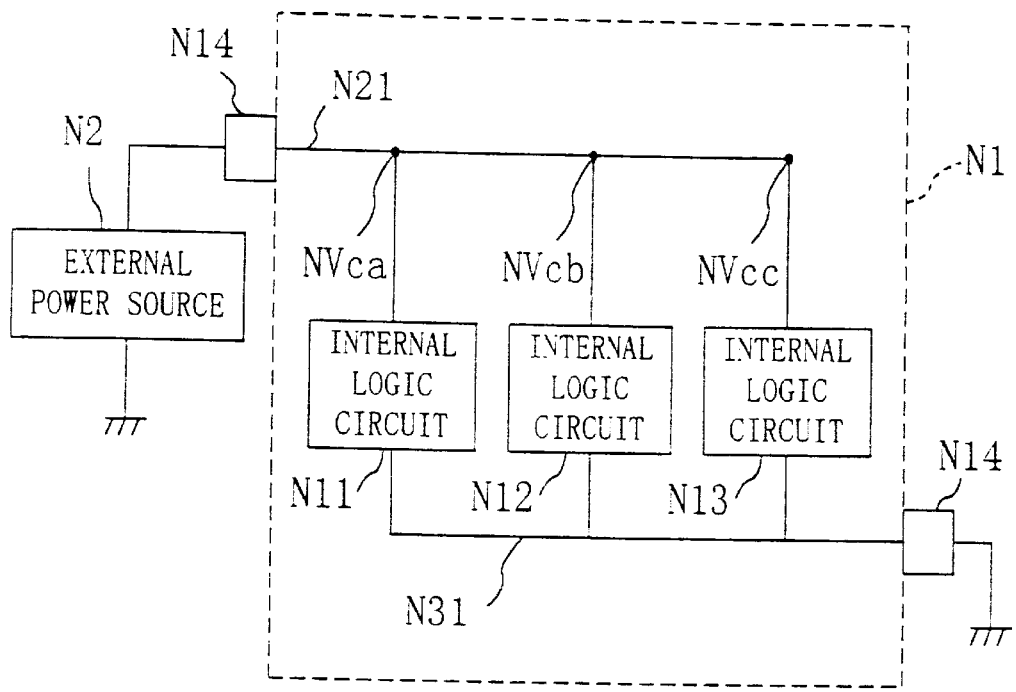
FIG. 16 shows the internal structure of a conventional semiconductor integrated circuit.

By contrast, the present embodiment operates as follows. FIG. 15 shows the voltage on the power-source line connecting to each of the internal logic circuits in the semiconductor integrated circuit.

If a voltage of 3V is assumed to be supplied from the external power source N2 to the semiconductor integrated circuit N1, the voltage NVc1 on the power-source line N21 for supplying a power-source voltage to each of the internal logic circuit is reduced by the operation of each of the logic circuits N11, N12, and N13 to a value NVc1a indicated by the broken line in FIG. 15. The voltage supplying circuit N15a detects a potential difference between a specified point N202 on the power-source line N22 and a specified difference N201 on the power-source line N21. If the operating voltage NV3 is assumed to be 0.1 V, e.g., a current is allowed to flow from the power-source line N22 to the power-source line N21 through the voltage supplying circuit N15a when a potential difference becomes 0.1 V or more, thereby suppressing a voltage drop on the power-source line N21. The voltage drop is indicated by the segment between "0" and "N201" of the solid line representing the voltage variation NVc1b in FIG. 15. Accompanying variations in the voltage NVc2 on the power-source line N22 are indicated by the segment between "N201" and "N202" of the solid line representing the voltage variation NVc2 in FIG. 15.

Although the operation of the voltage supplying circuits N15a and N15b on the power-source side has thus been described, the operation of the voltage supplying circuits N15c and N15d on the ground side is the same as described above and suppresses a voltage rise.

Third Embodiment

A third embodiment of the present invention will be described with reference to the drawings.

Figure 18:
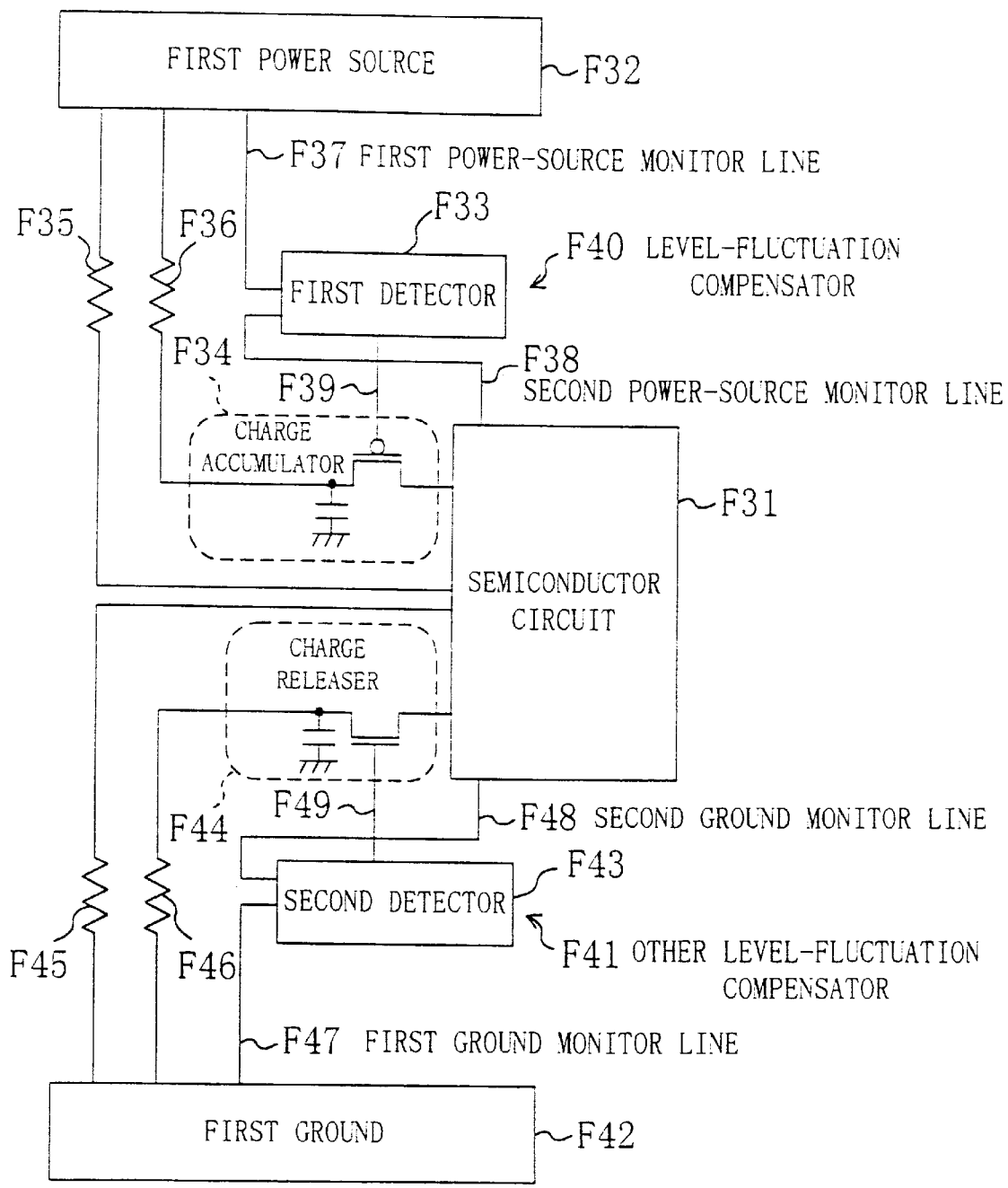
FIG. 18 shows the structure of a semiconductor integrated circuit according to a third embodiment of the present invention.

FIG. 18 shows the structure of a semiconductor integrated circuit according to the third embodiment of the present invention. In the drawing, a first power source (power source) F32 supplies a voltage to a semiconductor circuit (internal semiconductor circuit) F31 in the semiconductor integrated circuit via a resistor F35, while supplying charges to a charge accumulator F34 via a resistor F36. The charge accumulator F34 is composed of a capacitor and a PMOS transistor.

A first detector F33 receives the level of the voltage supplied from the first power source F32 through a first power-source monitor line F37 and the level of the power-source voltage inside the semiconductor circuit F31 supplied through a second power-source monitor line F38 and detects fluctuations in the level of the power-source voltage inside the semiconductor circuit F31 caused by the operation of the semiconductor circuit F31. An output signal F39 is outputted as the result of detection from the first detector F33, which turns OFF the gate of the PMOS transistor of the charge accumulator F34 if there is no fluctuation in the level of the power-source voltage and turns ON the gate of the PMOS transistor if the level of the power-source voltage fluctuates, thereby controlling the supply of charges from the charge accumulator F34 to the semiconductor circuit F31 and compensating for fluctuations in the level of the power-source voltage. The charge accumulator F34 and the first detector F33 compose a level-fluctuation compensator F40.

In FIG. 18 are shown: a first ground (power source) F42; a second detector F43; a charge releaser F44; resistors F45 and F46; a first ground monitor line F47; a second ground monitor line F48; and an output signal F49 from the second detector F43. Since the configuration on the side of the first ground F42 is the same as the configuration on the side of the first power source F32, the description thereof is omitted here. However, it is to be noted that the charge releaser F44 uses an NMOS transistor to control the level of the output signal F49 from the second detector F43 so that charges are extracted when the level of the ground voltage is increased in accordance with the characteristic of the NMOS transistor. The charge releaser F44 and the second detector F43 compose the other level-fluctuation compensator F41.

Figure 21A:
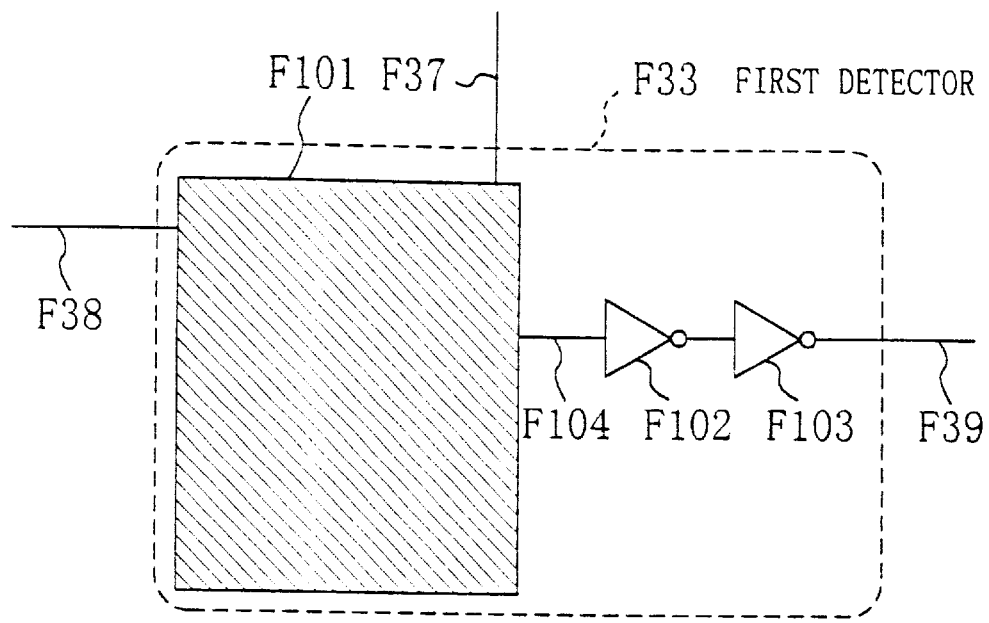
FIG. 21(a) shows a specific structure of a first detector and FIG. 21(b) shows a specific structure of a third detector.

FIG. 21(a) shows a specific structure of the first detector F33, which is composed of a differential amplifier F101 and inverters F102 and F103. The differential amplifier F101 compares the level of the power-source voltage supplied from the first power source F32 through the first power-source monitor line F37 with the level of the power-source voltage inside the semiconductor circuit F31 supplied through the second power-source monitor line F38, converts an output result F104 to an output signal F39 via the two inverters F102 and F103, and outputs the output signal F39. In the case where the levels of the power-source voltages supplied from the first and second power-source monitor lines F37 and F38 are equal, the differential amplifier F101 operates to output the output signal F39 on the HIGH level. On the other hand, when the semiconductor integrated circuit F31 operates to cause a voltage drop, the input voltage from the second power-source monitor line F38 becomes lower than the input from the first power-source monitor line F37, so that the differential amplifier F101 and the two inverters F102 and F103 operate to amplify the input voltages and produces the output signal F39 on the LOW level.

The output signal F39 from the first detector F33 is given to the charge accumulator F34 to control the PMOS transistor therein. In short, when the output signal F39 is HIGH, the gate of the PMOS transistor is turned OFF so that charges accumulated in the capacitor of the charge accumulator F34 are not supplied to the semiconductor circuit F31.

When the output signal F39 is LOW, on the other hand, the gate of the PMOS transistor is turned ON so that the charges accumulated in the capacitor of the charge accumulator F34 are supplied to the semiconductor circuit F31, thereby compensating for fluctuations in the level of the power-source voltage. If the capacitor of the charge accumulator F34 is designed to have large capacitance, the quantity of charges supplied to the semiconductor circuit F31 can be increased.

Figure 22A:
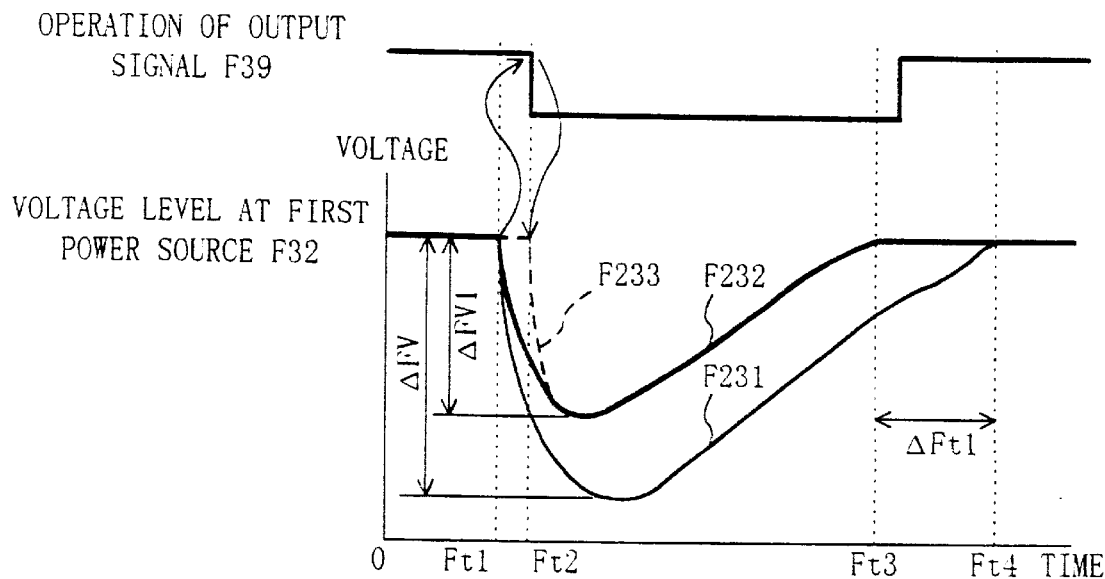
FIG. 22(a) illustrates the effect of supplying a power-source voltage to the semiconductor integrated circuit according to the third embodiment and FIG. 22(b) illustrates the effect of supplying a power-source voltage to the semiconductor integrated circuit according to the fourth embodiment.

FIG. 22(a) illustrates the effect of supplying the power-source voltage according to the third embodiment. In the case where a voltage drop occurs at the time Ft1 in the semiconductor circuit F31, if the charge accumulator F34 does not supply charges, the voltage inside the semiconductor circuit F31 significantly drops by the magnitude of the voltage ΔFV as indicated by the waveform F231 and is not restored to the original level till the time Ft4. In the third embodiment of the present invention, however, the charge accumulator F34 supplies charges in response to the output signal F39 on the LOW level from the first detector F33, as indicated by the waveform F233, so that the voltage drop in the semiconductor circuit F31 is suppressed to the magnitude of the voltage ΔFV1, as indicated by the waveform F232.

The time interval between the initiation of charge supply upon the turning ON of the PMOS transistor of the charge accumulator F34 and the restoration of the power-source voltage to the original level is determined by the product of the resistance of the resistor F35 which allows the passage of the voltage supplied from the first power source F32 to the semiconductor circuit F31 and the capacitance of the power-source line inside the semiconductor circuit F31 and by the quantity of charges used in the semiconductor circuit F31. As indicated by the waveform F232 in FIG. 22(a), fluctuations in the level of the power-source voltage inside the semiconductor circuit F31 can be compensated for in a shorter period by the time ΔFt1.

Although the operation of compensating for the voltage drop on the power-source line has been described, a similar operation can be performed with respect to an increase in the level of the ground voltage.

The semiconductor integrated circuit according to the third embodiment may have only the function of compensating for fluctuations in the level of the power-source voltage or the function of compensating for fluctuations in the level of the ground voltage or both of the functions in combination.

Fourth Embodiment

Figure 19:
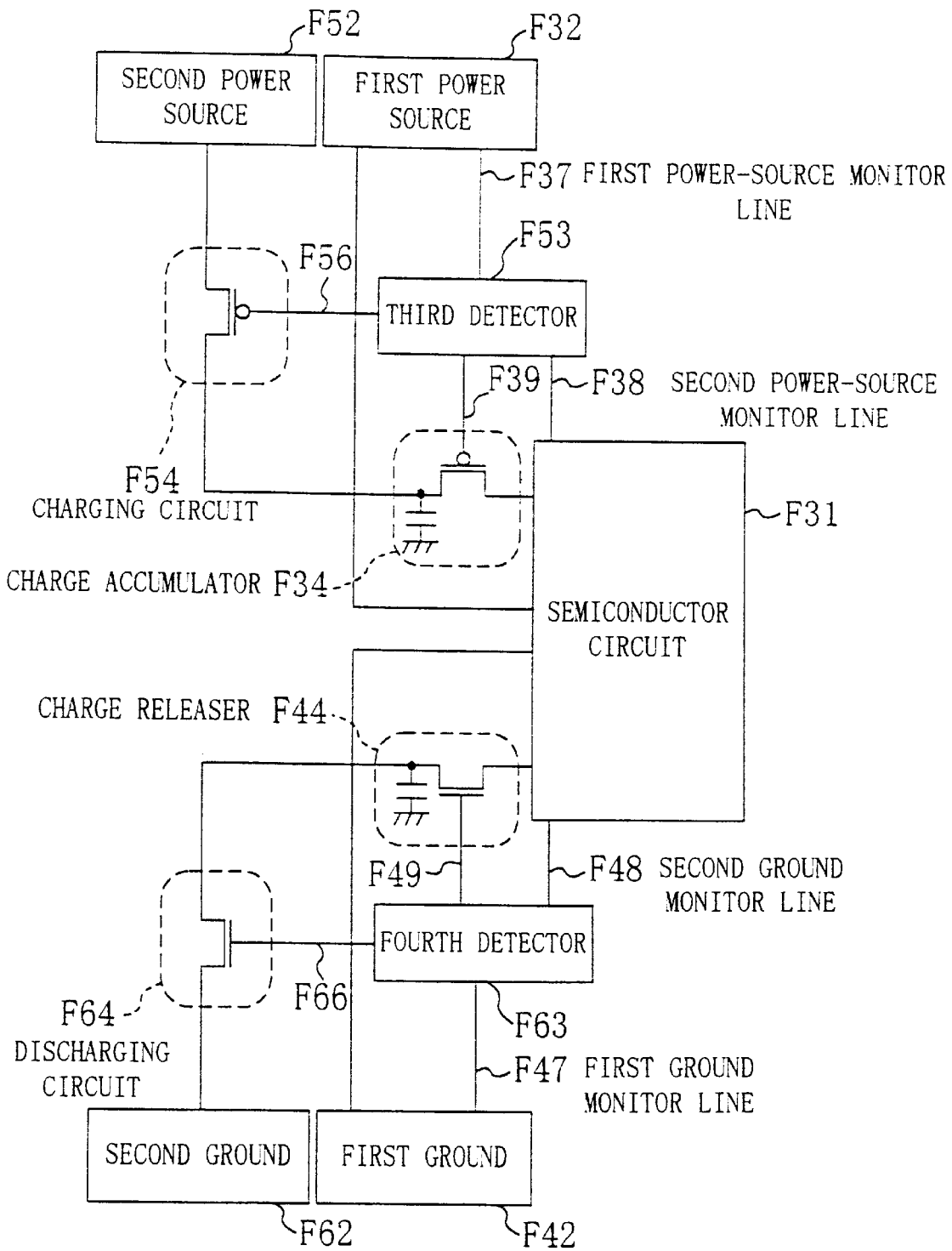
FIG. 19 shows the structure of a semiconductor integrated circuit according to a fourth embodiment of the present invention.

FIG. 19 shows the structure of a semiconductor integrated circuit according to a fourth embodiment of the present invention.

In the drawing, the first power source F32 supplies a voltage to the semiconductor circuit F31 in the semiconductor integrated circuit. A second power source F52 supplies charges to the charge accumulator F34 having the same structure as in the third embodiment through a charging circuit F54 composed of a PMOS transistor. The second power source F52 is so designed as to supply the voltage higher in level than the voltage supplied from the first power source F32.

A third detector F53 receives the level of the power-source voltage supplied from the first power source F32 through the first power-source monitor line F37 and the level of the power-source voltage inside the semiconductor circuit F31 supplied through the second power-source monitor line F38 and detects fluctuations in the level of the operating power-source voltage for the semiconductor circuit F31. As the result of detection by the third detector F53, a first output signal F56 and the second output signal F39 are outputted. The first output signal F56 turns ON the gate of the PMOS transistor in the charging circuit F54 so that charges are supplied from the second power source F52 to the charge accumulator F34. When the level of the power-source voltage fluctuates, the first output signal F56 turns OFF the PMOS transistor in the charging circuit F54 so that charges are not supplied from the second power source F52 to the charge accumulator F34. When there is no fluctuation in the level of the power-source voltage, the second output signal F39 turns OFF the gate of the PMOS transistor in the charge accumulator F34 so that charges are not supplied from the charge accumulator F34 to the semiconductor circuit F31. When the level of the power-source voltage fluctuates, the second output signal F39 turns ON the gate of the PMOS transistor in the charge accumulator F34 so that charges are supplied from the charge accumulator F34 to the semiconductor circuit F31.

In FIG. 19 are also shown: a first ground F42; a second ground F62; a fourth detector F63; a charge releaser F44; a first ground monitor line F47; a second ground monitor line F48; first and second output signals F56 and F39 from the third detector F53; and a discharging circuit F64. Since the configuration on the ground side is the same as the configuration on the power-source side, the description thereof is omitted here. However, it is to be noted that the charge releaser F44 and the discharging circuit F64 use NMOS transistors to control the voltage levels of the third and fourth output signals F66 and F47 so that charges are extracted when the level of the ground voltage is increased in accordance with the characteristics of the NMOS transistors.

Figure 21B:
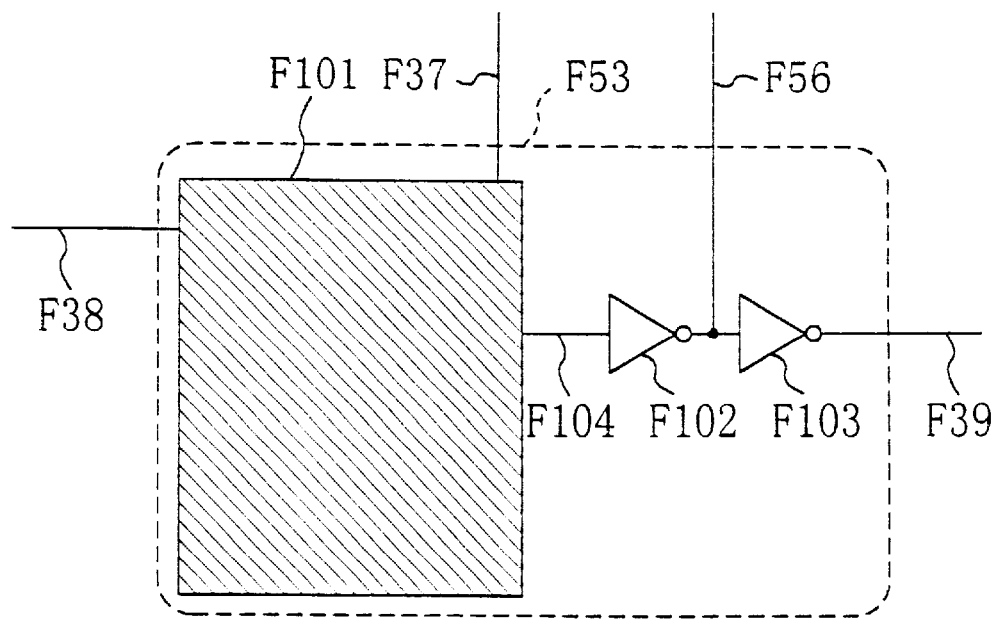

A specific structure of the third detector F53 is shown in FIG. 21(b), in which the third detector F53 is composed of the differential amplifier F101, the first inverter F102, and the second inverter F103. The differential amplifier F101 compares the level of the power-source voltage supplied from te first power source F32 through the first power-source monitor line F37 with the level of the power-source voltage inside the semiconductor circuit F32 supplied through the second power-source monitor line F38 and supplies the output F104 indicating the result of comparison to the first inverter F102. The first inverter F102 inverts the output F104 from the differential amplifier F101 and supplies the resulting signal as the first output signal F56 to the second inverter F103, which further inverts the value of an input signal and outputs the resulting value as the second output signal F39. In the case where the levels of the power-source voltages supplied from the first and second power-source monitor lines F37 and F38 are equal, the differential amplifier F101 operates to output the first output signal F56 on the LOW level and the second output signal F39 on the HIGH level. On the other hand, when the semiconductor integrated circuit F31 operates to cause a voltage drop, the input voltage from the second power-source monitor line F38 becomes lower than the input voltage from the first power-source monitor line F37, so that the differential amplifier F101 and the first inverter F102, and the second inverter F103 operate to amplify the input voltages and produces the first output signal F56 on the HIGH level and the second output signal F39 on the LOW level.

As described above, the first output signal F56 outputted as the result of the operation of the third detector F53 is supplied to the charging circuit F54 to control the PMOS transistor therein. On the other hand, the second output signal F39 is supplied to the charge accumulator F34 to control the PMOS transistor therein. Specifically, when there is no fluctuation in the level of the power-source voltage, the first output signal F56 on the LOW level is outputted, as described above, to turn ON the gate of the PMOS transistor in the charging circuit F54 so that charges from the second power source F52 are accumulated in the charge accumulator F34, while the second output signal F39 on the HIGH level is outputted to turn OFF the gate of the PMOS transistor in the charge accumulator F34 so that no charge is supplied to the semiconductor circuit F31. Conversely, when the level of the power-source voltage fluctuates, the first output signal F56 on the HIGH level is outputted to turn OFF the PMOS transistor in the charging circuit F54 so that charges from the second power source F52 are not accumulated in the charge accumulator F34, while the second output signal F39 on the LOW level is outputted to turn ON the gate of the PMOS transistor in the charge accumulator F34 so that the charges accumulated in the charge accumulator F34 are supplied to the semiconductor circuit F31.

Figure 22B:
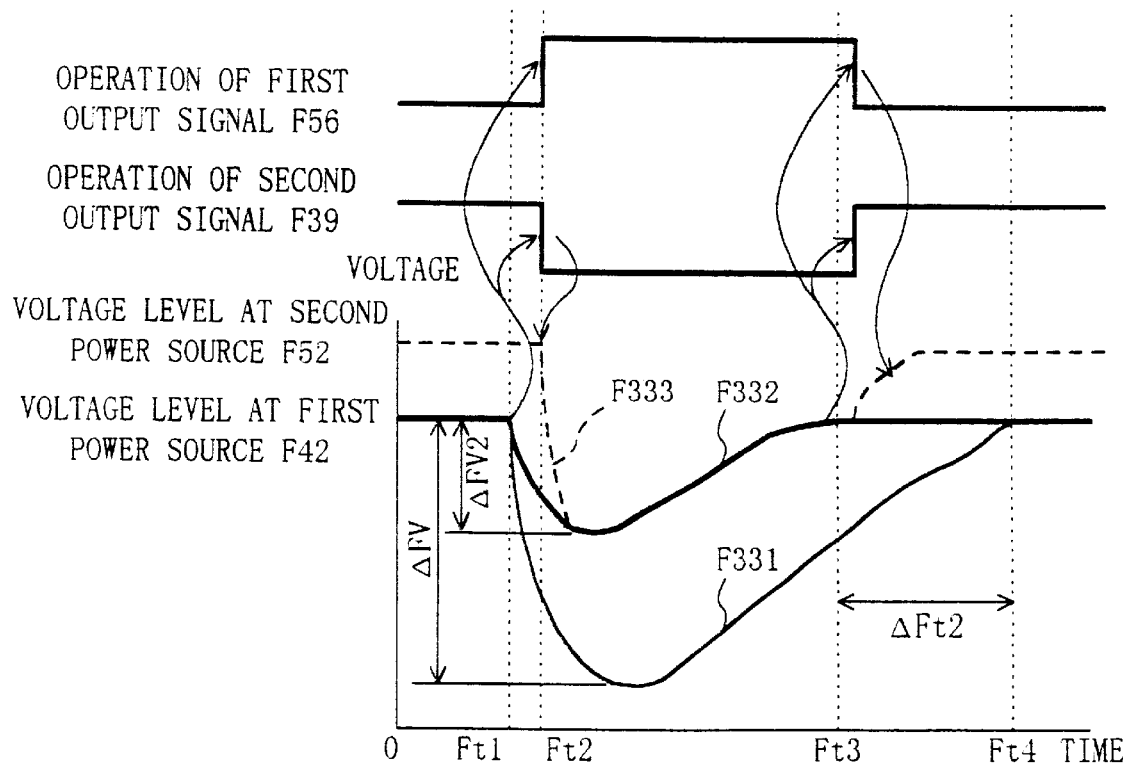

FIG. 22(b) shows the effect of supplying the power-source voltage according to the fourth embodiment of the present invention. In the semiconductor circuit F31, when there is a voltage drop at the time Ft1, the third detector F53 detects the fluctuation of the level of the power-source voltage so that the first output signal F56 on the HIGH level and the second output signal F39 on the LOW level are outputted. Thereafter, the supply of charges from the second power source F52 to the charge accumulator F34 is halted and the charge accumulated in the charge accumulator F32 are supplied to the semiconductor circuit F31. The level of the power-source voltage in the semiconductor circuit F31 and the level of the power-source voltage in the charge accumulator F34 at that time are designated at F332 and F333, respectively. As indicated by the waveform F331, the power-source voltage in the semiconductor circuit F31 significantly drops by the magnitude of the voltage $\Delta FV$ when no power-source voltage is supplied and is not restored to the original level till the time Ft4. According to the fourth embodiment of the present invention, by contrast, the voltage drop is suppressed to the magnitude of $\Delta FV2$ ($\Delta FV2<\Delta FV$) and the power-source voltage can be restored to the original level in a shorter period by the time $\Delta Ft2$.

Moreover, the power-source voltage in the charge accumulator F34 is higher in level than the power-source voltage used in the semiconductor circuit F31, which achieves the following effects:

(1) Since the potential difference between the source and drain of the PMOS transistor supplying charges to the semiconductor circuit F31 is increased, the charges can be supplied at a higher speed than in the third embodiment. Hence, in contrast to the third embodiment of the present invention which has compensated for fluctuations in the level of the power-source voltage in a shorter period by the time $\Delta Ft1$ than in the case where no power-source voltage is supplied to the semiconductor circuit F31, as shown in FIG. 22(a), the fourth embodiment of the present invention can compensate for fluctuations in the level of the power-source voltage in a still shorter period by the time $\Delta Ft2$ ($\Delta Ft2>\Delta Ft1$), as shown in FIG. 22(b).

(2) As can be understood from the equation Q=CV, the quantity Q of charges is larger as the voltage V is larger when the capacitance of the capacitor of the charge accumulator F34 is equal. Accordingly, more charges can be supplied to the semiconductor circuit F31 in the fourth embodiment of the present invention than in the third embodiment thereof. When no power-source voltage is supplied to the semiconductor circuit F31, therefore, the voltage drops by the magnitude of the voltage $\Delta FV$, which is considerably large. However, the magnitude of the voltage drop is reduced to the voltage $\Delta FV1$ in the third embodiment of the present invention, which can further be reduced to the voltage $\Delta FV2$ ($\Delta FV2<\Delta FV1$) in the fourth embodiment thereof.

Although the description has been given to the operation of compensating for the voltage drop on the power-source line, the same operation is performed with respect to an increase in the level of the ground voltage as described above.

Thus, according to the present embodiment, the voltage drop on the power-source line can be minimized, while fluctuation on the level of the power-source voltage can be compensated for in a shorter time, resulting in stable circuit operation.

Figure 20:
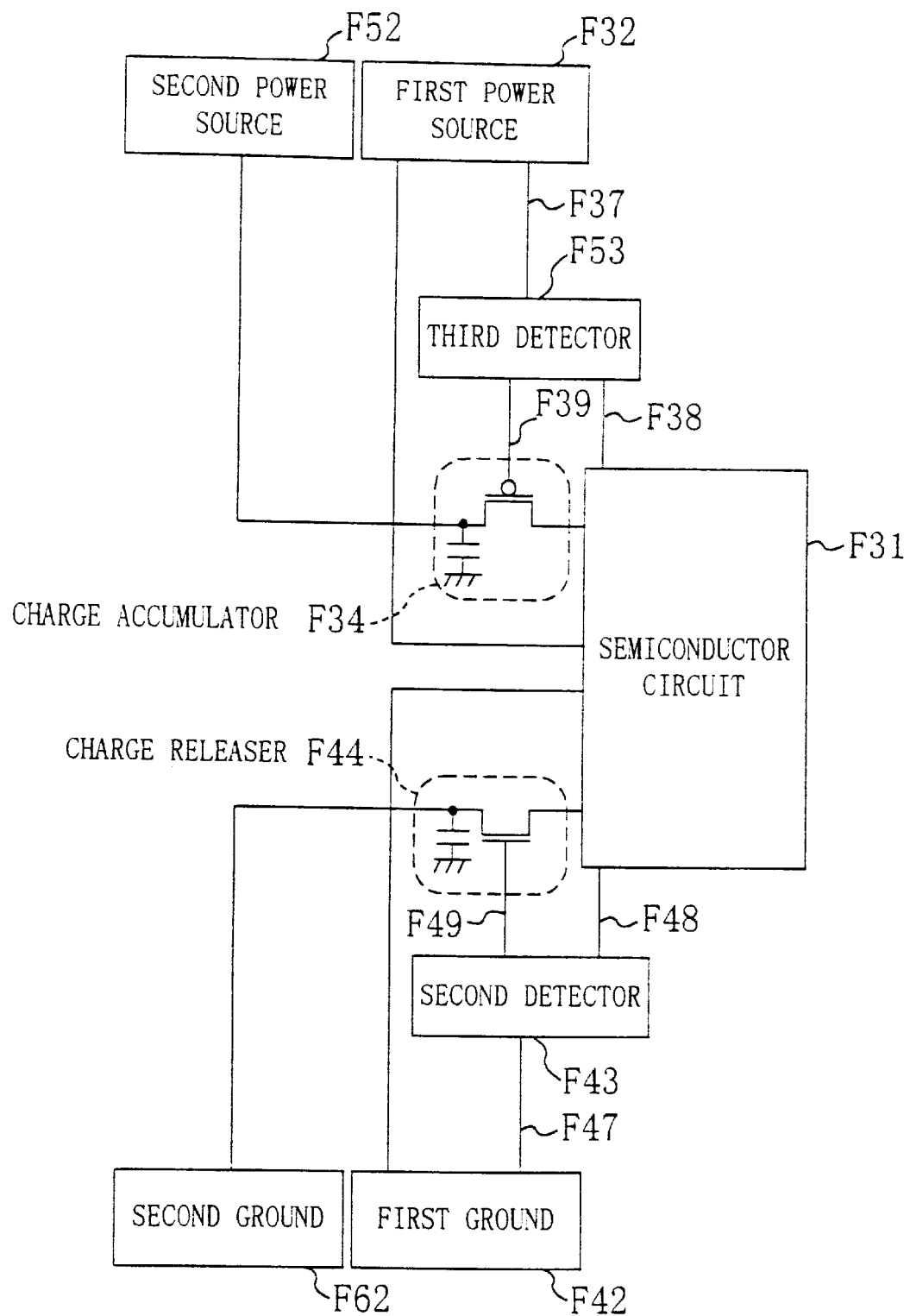
FIG. 20 shows the structure of a variation of the semiconductor integrated circuit according to the fourth embodiment.

Similar effects can be achieved even when the first detector F33 shown in FIG. 18 is used in place of the third detector F53 shown in FIG. 19 and the second power source is connected directly to the charge accumulator F34 without using the first output signal F56 and the charging circuit F54, as shown in FIG. 20. In this case, the voltage level F331 on the power-source line in the semiconductor circuit F31 may be higher than the standard power-source level when fluctuations in the level of the power-source voltage are compensated for as illustrated by FIG. 22(b).

It is to be noted that the semiconductor integrated circuit according to the fourth embodiment of the present invention may have only the function of compensating for fluctuations in the level of the power-source voltage or the function of compensating for fluctuations in the level of the ground voltage or both of the functions.

Fifth Embodiment

A description will be given to a fifth embodiment of the present invention, which relates to a method of automatic layout design. The structure of the present embodiment will be described briefly and then in greater detail by using a specific example.

Figure 23:
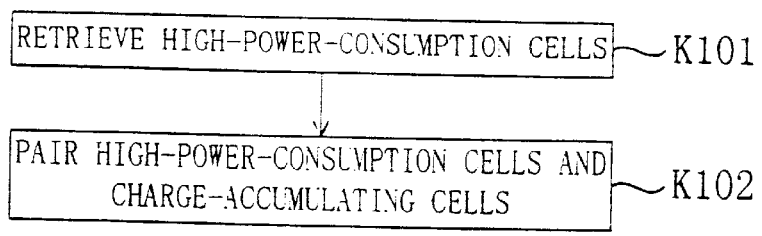
FIG. 23 shows the flow of a clustering process in accordance with an automatic layout designing method according to a fifth embodiment of the present invention.

FIG. 23 is a flow chart illustrating a clustering method implemented prior to automatic layout design. The clustering method illustrated in FIG. 23 comprises: a retrieving step K101 for retrieving high-power-consumption macro cells (designated at K1002 in FIG. 35); and a pairing process step K102 for pairing each of the high-power-consumption macro cells with a charge-accumulating cell (designated at K1201 in FIG. 35).

Figure 24:
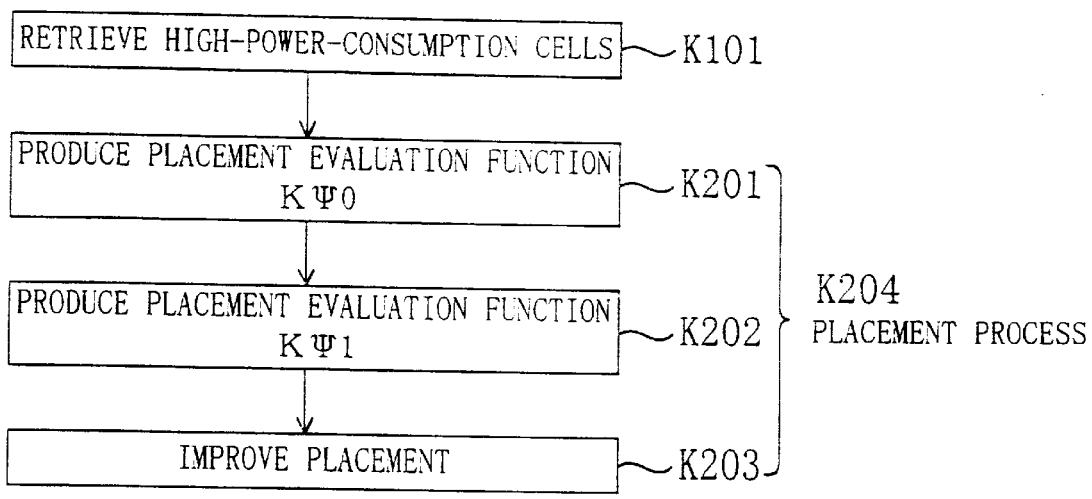
FIG. 24 shows the flow of a placement process in accordance with the automatic layout designing method according to the fifth embodiment.

FIG. 24 shows the flow of a placement process in automatic layout design. The flow of the placement process shown in FIG. 24 includes the retrieving step K101 for retrieving high-power-consumption macro cells (designated at K1002 in FIG. 35) and a placement step K204. The placement step K204 is composed of: a placement-evaluation-function calculating step K201 of calculating a placement evaluation function KΨ0; an another-placement-evaluation-function calculating step K202 of adding the reciprocal 1/Kdb of the distance Kdb between the individual high-power-consumption macro cells (K1002) to the placement evaluation function KΨ0 to provide another placement evaluation function KΨ1; and a placement improving step K203 of repeatedly improving the placement to minimize the placement evaluation function KΨ1.

Figure 25:
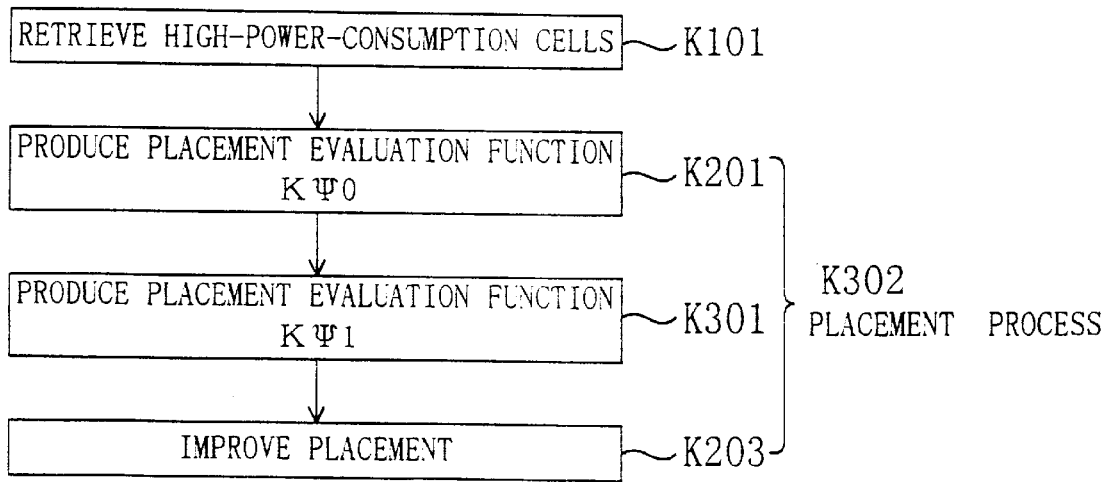
FIG. 25 shows the flow of another placement process in accordance with the automatic layout designing method according to the fifth embodiment.

FIG. 25 shows the flow of another placement process in automatic layout design. The flow of the placement process shown in FIG. 25 includes the retrieving step K101 for retrieving high-power-consumption macro cells (designated at K1002 in FIG. 35) and a placement step K302. The placement step K302 is composed of: the placement-evaluation-function calculating step K201 of calculating the placement evaluation function KΨ0; an another-placement-evaluation-function calculating step K301 of adding the distance Kde between the high-power-consumption macro cell (K1002) and a basic power-source line (designated at K1102 in FIG. 36) in the vicinity of the high-power-consumption macro cells to the placement evaluation function KΨ0 to provide another placement evaluation function KΨ1'; and the placement improving step K203 of repeatedly improving the placement to minimize the placement evaluation function KΨ'.

Figure 26:
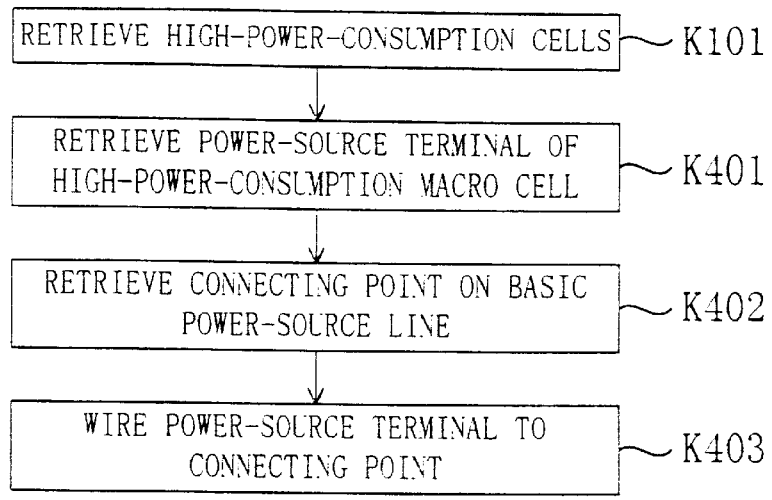
FIG. 26 shows the flow of a wiring process with an auxiliary power-source line in accordance with the automatic layout designing method according to the fifth embodiment.

FIG. 26 shows the flow of a power-source-auxiliary-line adding process in automatic layout design. The flow of the power-source-auxiliary-line adding process shown in FIG. 26 is composed of: the retrieving step K101 of retrieving high-power-consumption macro cells (K1002); a retrieving step K401 of retrieving the points of the power-source terminals (designated at K1502 in FIG. 36) of the high-power-consumption macro cells (K1002); a retrieving step K402 of retrieving a connecting point (designated at K1503 in FIG. 36) on the basic power-source line (designated at K1102 in FIG. 36) to the high-power-consumption macro cells which minimizes the distances between the high-power-consumption macro cells and the basic power-source line; and a wiring step K403 of wiring between the points of the power-source terminals K1502 of the high-power-consumption macro cells and the connecting point K1503 with power-source auxiliary lines.

Figure 27:
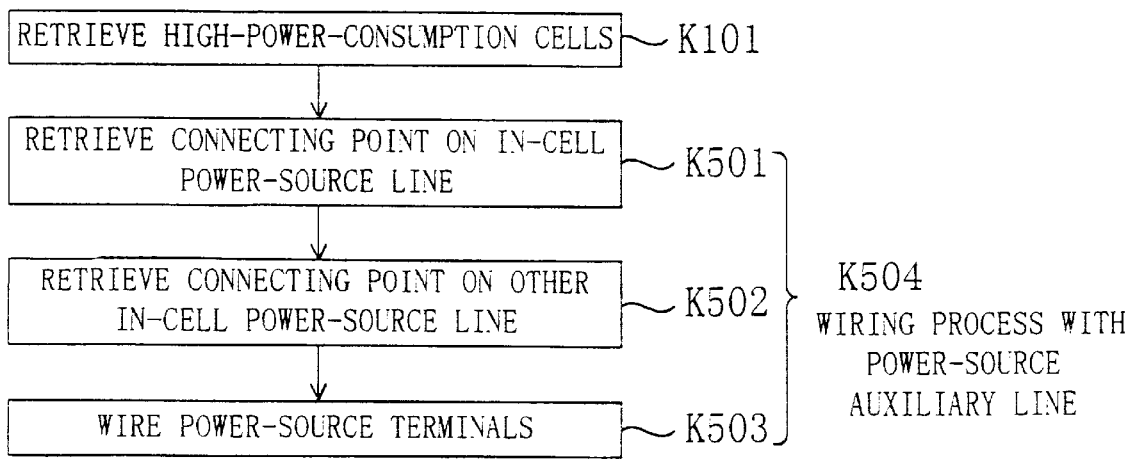
FIG. 27 shows the flow of another wiring step with the auxiliary power-source line in accordance with the automatic layout designing method according to the fifth embodiment.

FIG. 27 shows the flow of the power-source-auxiliary-line adding process in automatic layout design. The flow of the power-source-auxiliary-line adding process shown in FIG. 27 includes the retrieving step K101 of retrieving high-power-consumption macro cells K1002 and a wiring step K504 with a power-source auxiliary line. The wiring step K504 with a power source auxiliary line is composed of: a retrieving step K501 of retrieving a connecting point (designated at K1504 in FIG. 37) on an in-cell power-source line (designated at K1507 in FIG. 37) supplying electric power to any of the high-power-consumption macro cells; a retrieving step K502 of retrieving a connecting point (designated at K1506 in FIG. 37) on another in-cell power-source line located in the vicinity of the foregoing in-cell power-source line and not supplying power to any of the high-power-consumption macro cells (K1002); and a wiring step K503 of wiring the connecting points K1504 and K1506 with a power-source auxiliary line.

Figure 28:
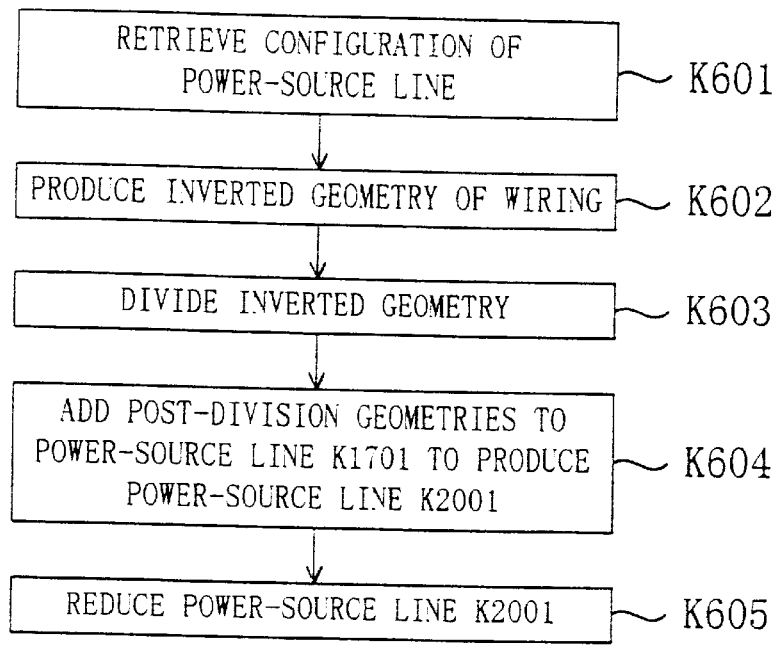
FIG. 28 shows the flow of a power-source-line thickening process in accordance with the automatic layout designing method according to the fifth embodiment.

FIG. 28 shows the flow of a power-source-line thickening process performed with respect to the result of automatic layout design. The flow shown in FIG. 28 is composed of: a retrieving step K601 of retrieving the a power-source-line configuration (designated at K1701 in FIG. 38); a producing step K602 of producing the inverted geometry (designated at K1801 in FIG. 39) of wiring in a wiring layer containing the power-source lines; a dividing step K603 of dividing the inverted geometry K1801 into two geometries (designated at K1901 and K1902 in FIG. 40); a mask operation step K604 of producing a power-source-line configuration (designated at K2001 in FIG. 41) by adding the two post-division geometries K1901 and K1902 to the power-source-line configuration K1701 by a mask processing operation; and a mask operation step K605 of generating a power-source-line configuration (designated at K2101 in FIG. 42) by reducing the power-source-line configuration K2001 by the magnitude of a predetermined minimum wire spacing Kdr.

The embodiment of the present invention will be described by using a specific example of the flow of layout design in accordance with a standard cell method, including the sequential steps of clustering or pairing elements illustrated in FIG. 23, placing and wiring macro cells in a region in which the power-source-line configuration has preliminarily been specified illustrated in FIGS. 26 and 27, and mask processing after placement and routing illustrated in FIG. 28.

The standard cell method is a design technique using macro cells K802 each having upper and lower power-source lines K1701 to be linked by simply arranging the macro cells K802 in rows. In accordance with the standard cell method, the power-source lines normally have equal widths.

Figure 29:
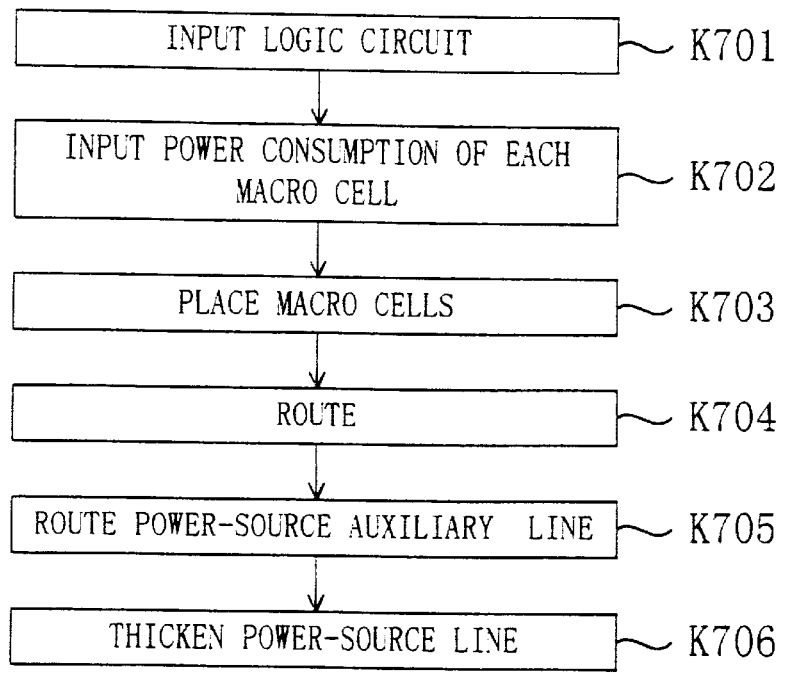
FIG. 29 shows the flow of the processes in accordance with the automatic layout designing method according to the fifth embodiment.

FIG. 29 shows the flow of processes according to the present embodiment. In Step K701, information representing a logic circuit to be designed by the present invention is inputted. In Step K702, power consumption per macro cell is inputted to execute a layout process in consideration of power consumption of each macro cell composing the logic circuit. In Step K703, there is performed the process of placing macro cells in consideration of the amount of power consumption shown in FIGS. 23, 24, and 25. In Step K704, wiring is performed with respect to the result of placement. In Step K705, there is performed the process of wiring with the auxiliary power-source line for supplying power. In Step K706, a mask operation process is performed to thicken the power-source line shown in FIG. 28.

The flow shown in FIG. 29 will be described in greater detail.

Figure 30:
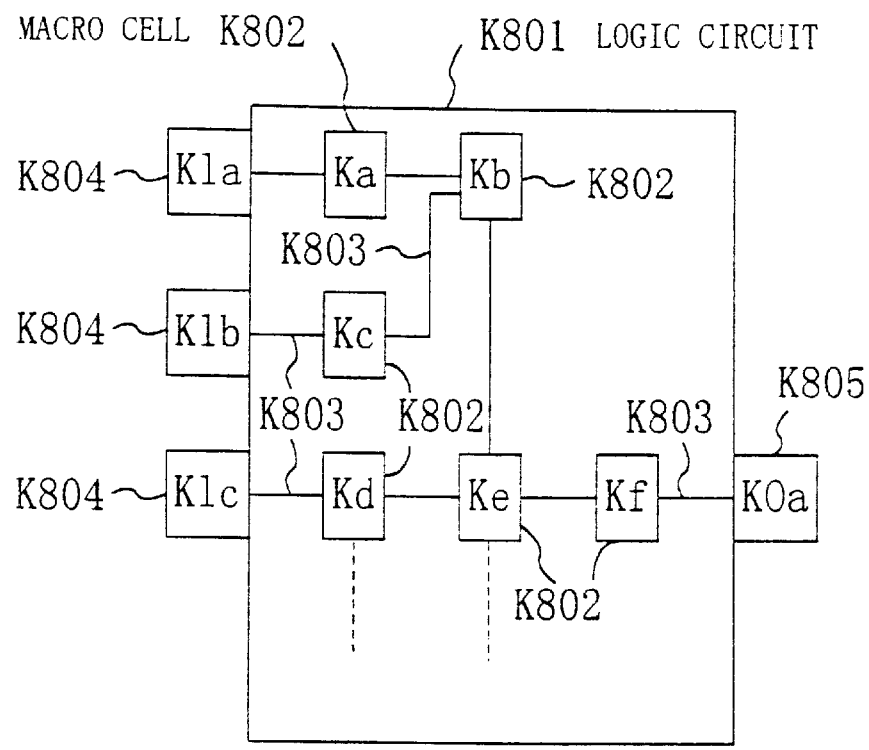
FIG. 30 shows an example of a logic circuit.

The logic circuit K801 shown in FIG. 30 comprises: the plurality of macro cells K802; connecting wires K803 between the individual macro cells; an input terminal K804; and an output terminal K805. In FIG. 30 are shown: identifiers Ka to Kf for the macro cells K802; identifiers KIa to KIc for the input terminals of the logic circuit K801; and an identifier KOa for the output terminal of the logic circuit K801.

Figure 31:
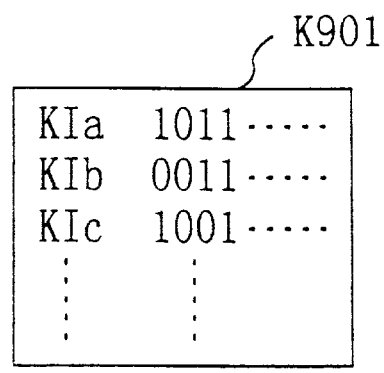
FIG. 31 shows an example of a simulation test vector.
Figures 32, 33:
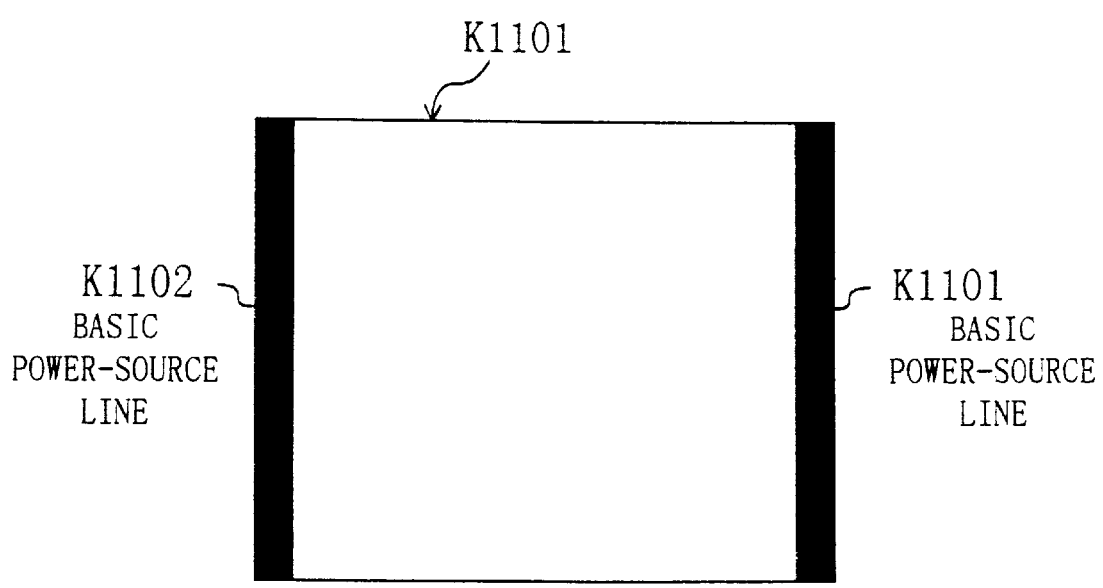
FIG. 32 shows an example of power consumption per macro cell.
FIG. 33 shows a macro-cell placement region in which the basic power-source lines have been placed.

FIG. 31 shows an example of a simulation test vector K901, in which the time-varying values of respective input signals to the input terminals K804 of the logic circuit 801 are described. FIG. 32 shows an example of the amount of power consumption of each of the macro cells K802. The amount of power consumption K1001 is calculated from the operability of each of the macro cells K802 obtained by the execution of a logic simulation using the simulation test vector K901 and from the value of power consumed by one operation of each of the macro cells K802.

In Step K701 shown in FIG. 29, the information representing the logic circuit K801 shown in FIG. 30 is inputted.

Next, in Step K702, the amount of power consumption K1001 of each of the macro cells K802 is inputted.

The flow of processes in the subsequent Step K703 will be described with reference to FIG. 43. In Step K101 shown in FIG. 34, there is performed the process of extracting the macro cells K802 each consuming power over a given value Kco as the high-power-consumption macro cells K1002 (high-power-macro-cell retrieving step). If the value Kco of power consumption is assumed to be 9 μW, then, Ka, Kb, and Ke are retrieved as the high-power-consumption macro cells K1002 from FIG. 32.

Figure 44:
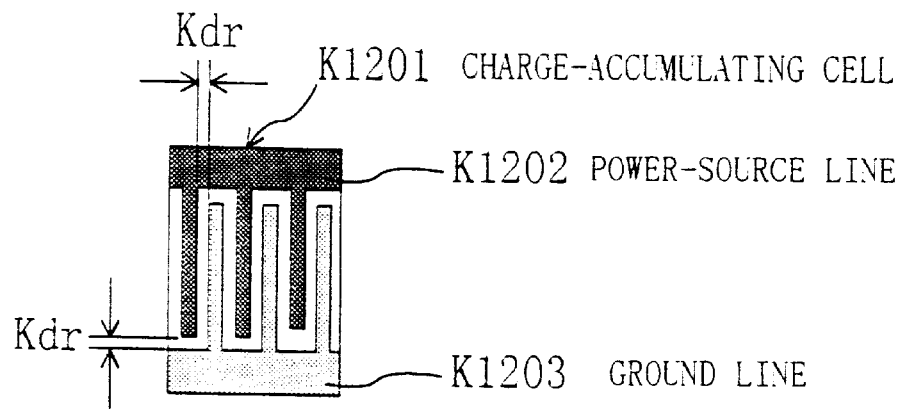
FIG. 44 shows a charge-accumulating cell.
Figure 45:
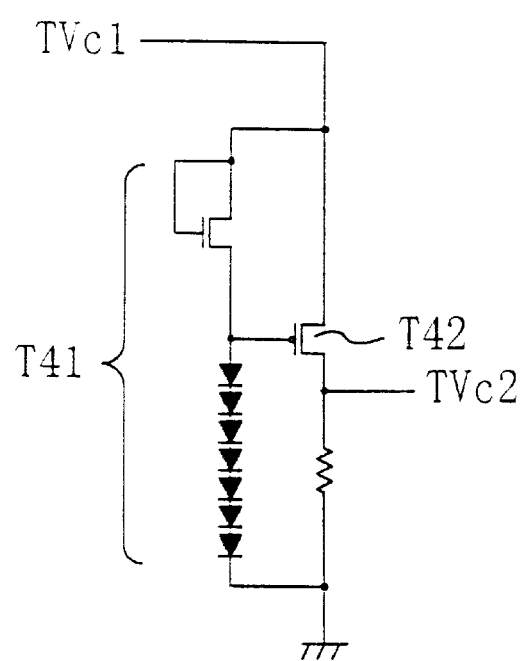
FIG. 45 shows an example of a constant-voltage generator embedded in the conventional semiconductor integrated circuit.
Figure 46:
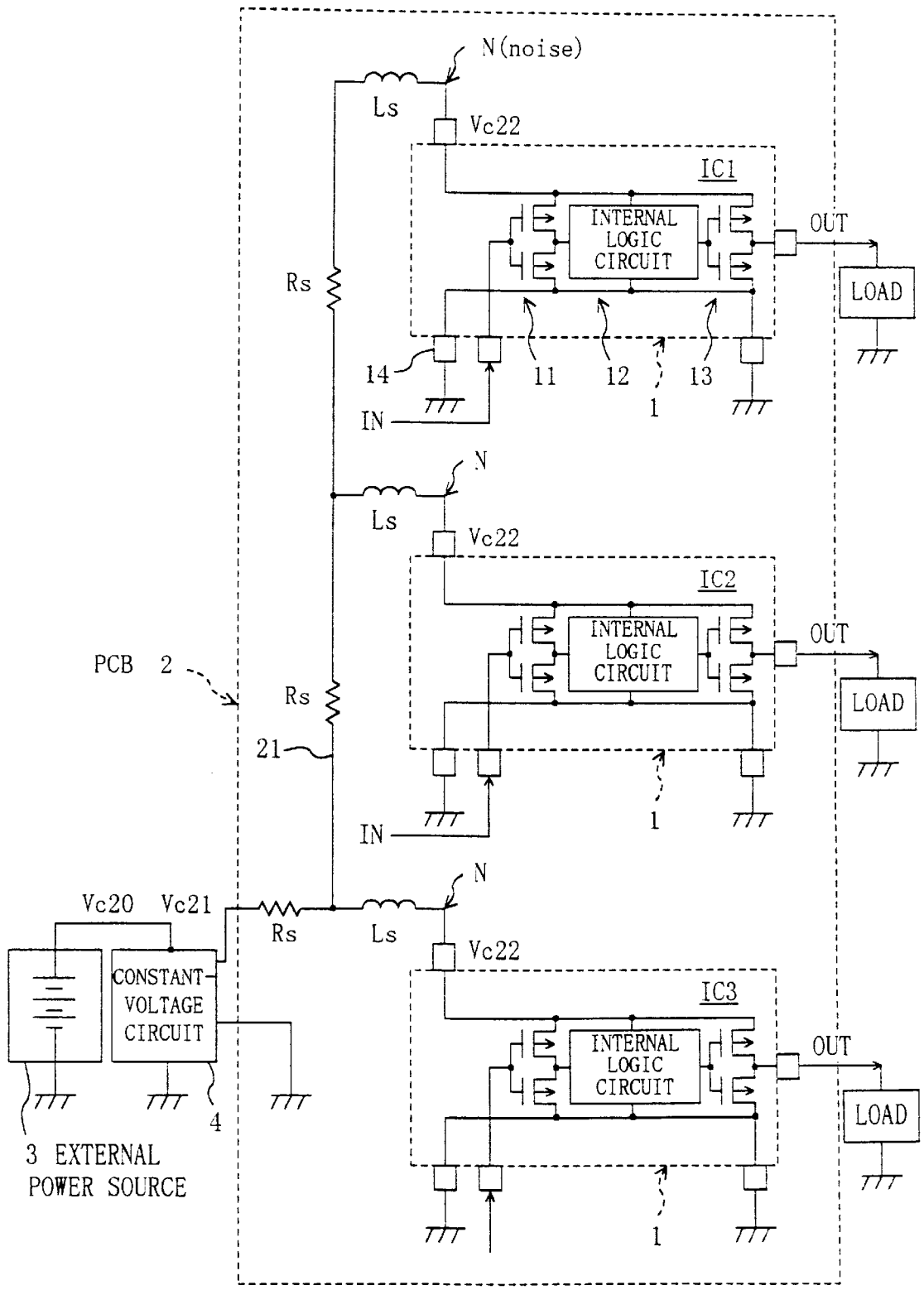
FIG. 46 shows a schematic structure of the conventional semiconductor integrated circuit.
Figure 47:
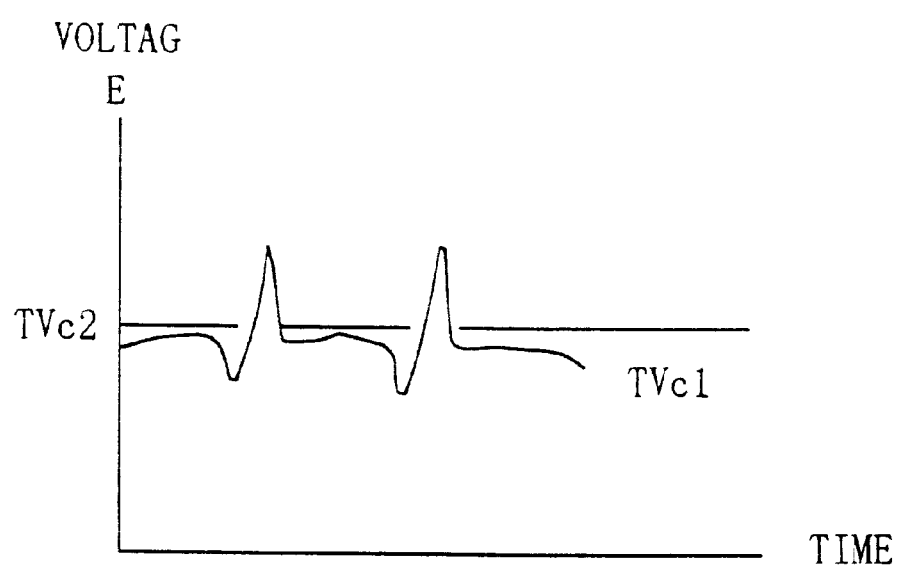
FIG. 47 shows external and internal power-source voltages of the conventional semiconductor integrated circuit.

In Step K102, there is performed the process of paring each of the retrieved high-power-consumption macro cells with a charge-accumulating cell (pairing step). Here, as shown in FIG. 44, the charge-accumulating cell K1201 is composed of a pair of comb-shaped power-source line K1202 and comb-shaped ground line K1203 combined with each other with their teeth alternately arranged. The terminology "pair" is redefined here as designated at K1002' (see FIG. 34). The pair 1002' are treated as if they are composing one macro cell K802 in accordance with the automatic layout method. The process ensures a power supply from the charge-accumulating cell K1201 to the mating high-power-consumption macro cell K1002 and stabilizes the voltage.

Figure 43:
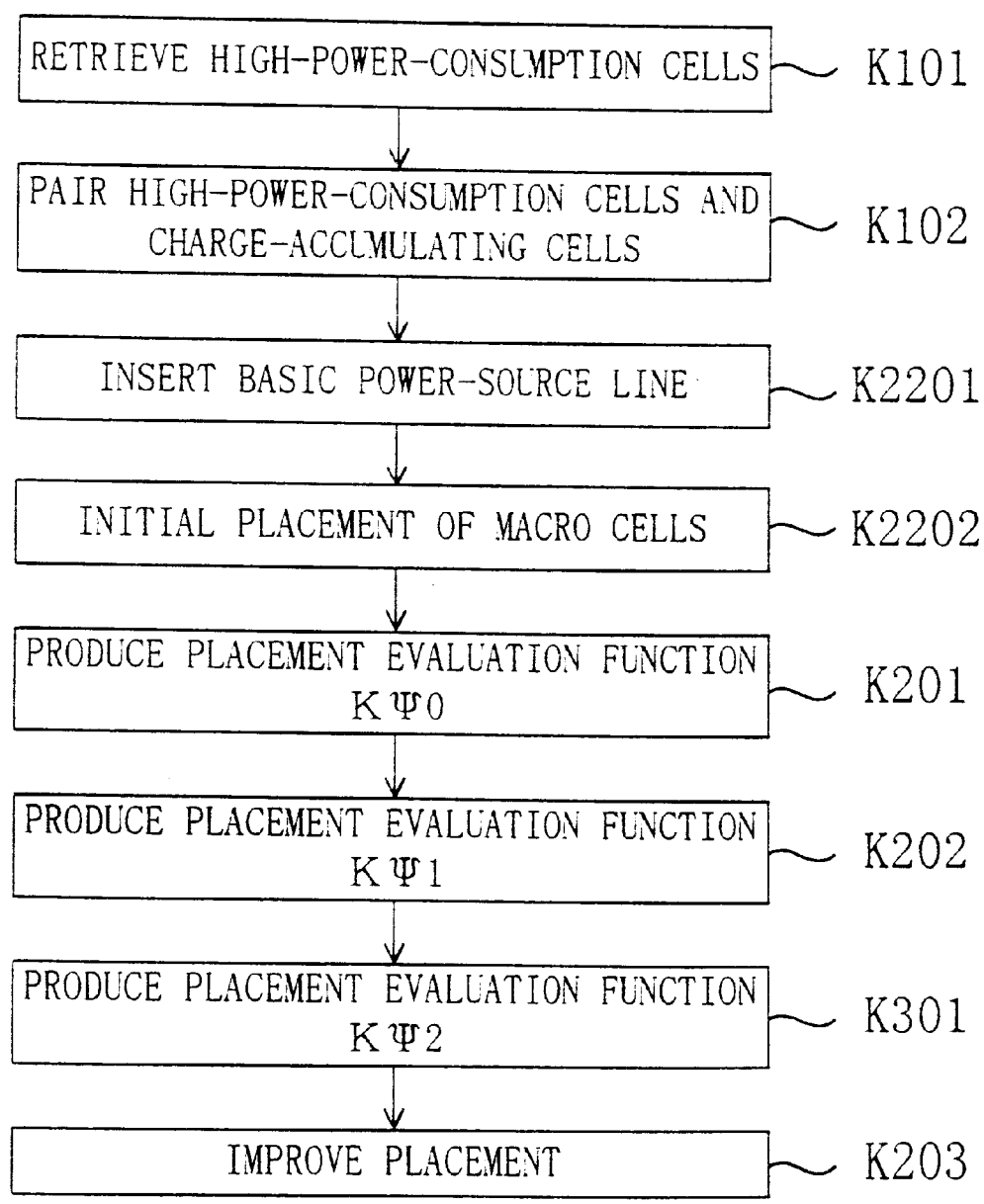
FIG. 43 shows the flow of a macro-cell placing process in accordance with the automatic layout designing method according to the fifth embodiment.

In Step K2201 shown in FIG. 43, there is performed the process of specifying the positions at which the basic power-source lines K1102 are to be placed in the macro-cell placement region K1101 (position specifying step). Here, the basic power-source lines K1102 are placed on the left and right sides of the macro-cell placement region K1101.

Figure 34:
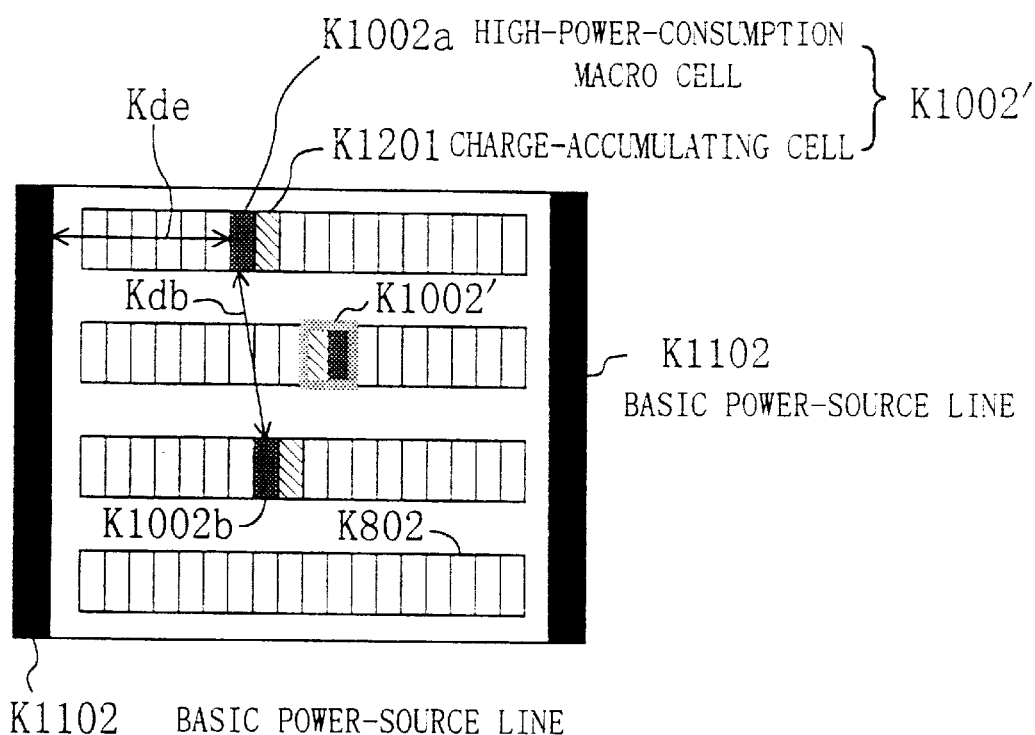
FIG. 34 shows the result of an initial placement of the macro cells.

In Step K2202, there is performed the process of initially placing the macro cells in the macro cell region K1101. As shown in FIG. 34, there is obtained an initial placement result K1301 in which the high-power-consumption macro cells 1002 and the charge-accumulating cells K1201 are placed in the pairs K1002'.

In Step K201, there is performed the process (placement-evaluation-function calculating step) of calculating the conventional placement evaluation function $K\Psi 0$. Here, the placement evaluation function $K\Psi 0$ is composed of a placement area KS, a wire length KL, and a signal propagation time KT.

In Step K202, there is performed the process of calculating another evaluation function $K\Psi 1$ by adding the reciprocal of the distance between the individual high-power-consumption macro cells K1002 to the foregoing placement evaluation function $K\Psi 0$ (another-evaluation-function calculating step). Specifically, as shown in FIG. 34, the reciprocal of the distance Kdb between the two high-power-consumption macro cells K1002a and K1002b is added to the foregoing placement evaluation function $K\Psi 0$ as represented by the foregoing equation (1):

$$K\Psi 1 = K\Psi 0 + 1/Kdb \quad (1).$$

In Step K301, as shown in FIG. 34, there is performed the process of calculating another evaluation function $K\Psi 2$ by adding the distance Kde between the high-power-consumption macro cell K1002 and the basic power-source line K1102 to the foregoing placement evaluation function $K\Psi 1$ (another-evaluation-function calculating step). Specifically, the distance Kde between the high-power-consumption macro cell K1002a and the basic power-source line K1102 is added to the placement evaluation function $K\Psi 1$ as represented by the following equation (2):

$$K\Psi 2 = K\Psi 1 + Kde = K\Psi 0 + 1/Kdb + Kde \quad (2).$$

In Step K203, there is performed the placement improving process. For simplicity, a description will be given to the case where the pairwise interchange method is used.

In accordance with the pairwise interchange method, two macro cells selected at random are interchanged with a view to changing the result of placement. When a post-interchange value obtained from the placement evaluation function is smaller than a pre-interchange value, the post-interchange placement should be adopted. Otherwise, the result of placement should not be changed. Such an evaluation process is repeatedly performed to minimize the placement evaluation function. In this case, the foregoing evaluation function $K\Psi 2$ is used as a placement evaluation function so that the placement which minimizes the placement evaluation function $K\Psi 2$ is obtained.

Figure 35:
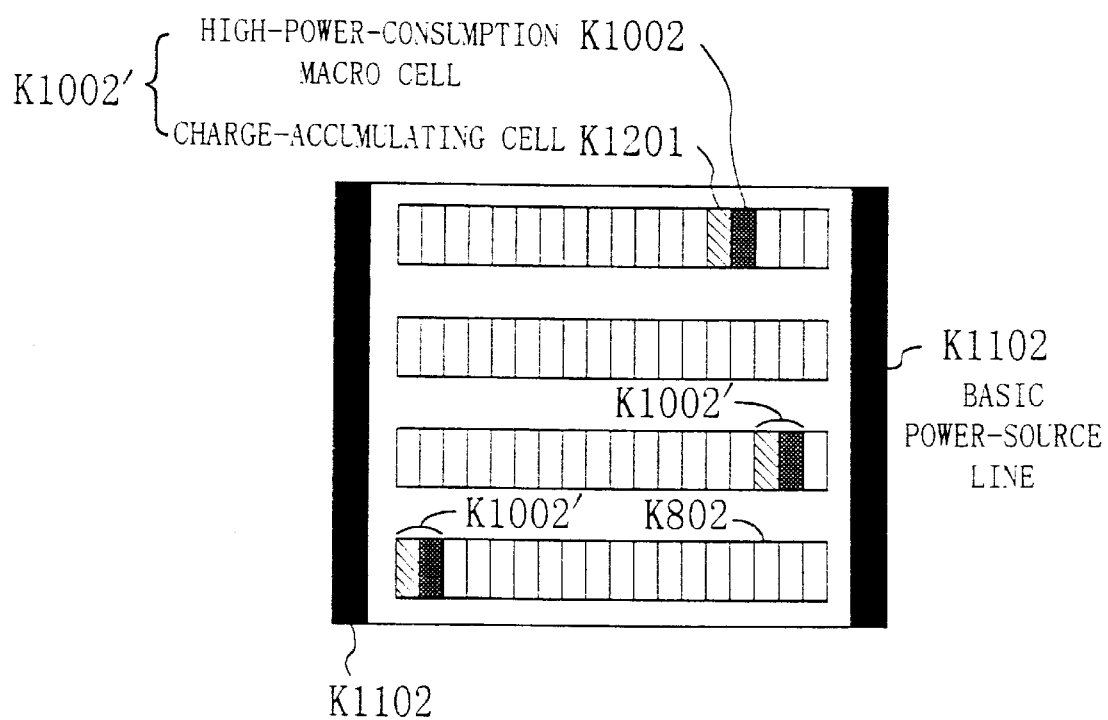
FIG. 35 shows the result of a placement of the macro cells.

From the foregoing description, it will be understood that the process performed in Step K703 provides a macro-cell placement result K1401 in which the high-power-consumption macro cells K1002 are dispersively positioned in the vicinity of the basic power-source lines K1102, as shown in FIG. 35.

Subsequently, in Step K704, there is performed the process of wiring the terminals of the macro cells K802 based on the logic circuit K801 in the macro-cell placement result K1401 to provide a part of the result of wiring as a macro-cell placement/routing result K1501. The result of wiring performed with respect to the placement shown in FIG. 35 in the present process is partially and enlargedly shown in FIG. 36, in which wiring is designated at K1508.

Next, the flow of processes in the power-source-auxiliary-line routing step K705 after placement and routing shown in FIG. 29 will be described with reference to FIGS. 26 and 27.

In Step K401 shown in FIG. 26, there is performed the process of retrieving the points of the power-source terminals of the high-power-consumption macro cells K1002 (power-source-terminal-points retrieving step). Specifically, the process is for retrieving the positions at which the high-power-consumption macro cells K1002 are placed from the macro-cell placement/routing result K1501 to provide the points of the power-source terminals K1502 of the high-power-consumption macro cells K1002.

In Step K402, there is performed the process of retrieving a connecting point on the basic power-source line K1102 which minimizes the distance from the point of the power-source terminal K1502 (connecting-point retrieving step). In the process, the distance Kde between the point of the power-source terminal K1502 and the nearest basic power-source line K1102 is calculated to provide the connecting point K1503 on the basic power-source line which minimizes the distance Kde.

Figure 37:
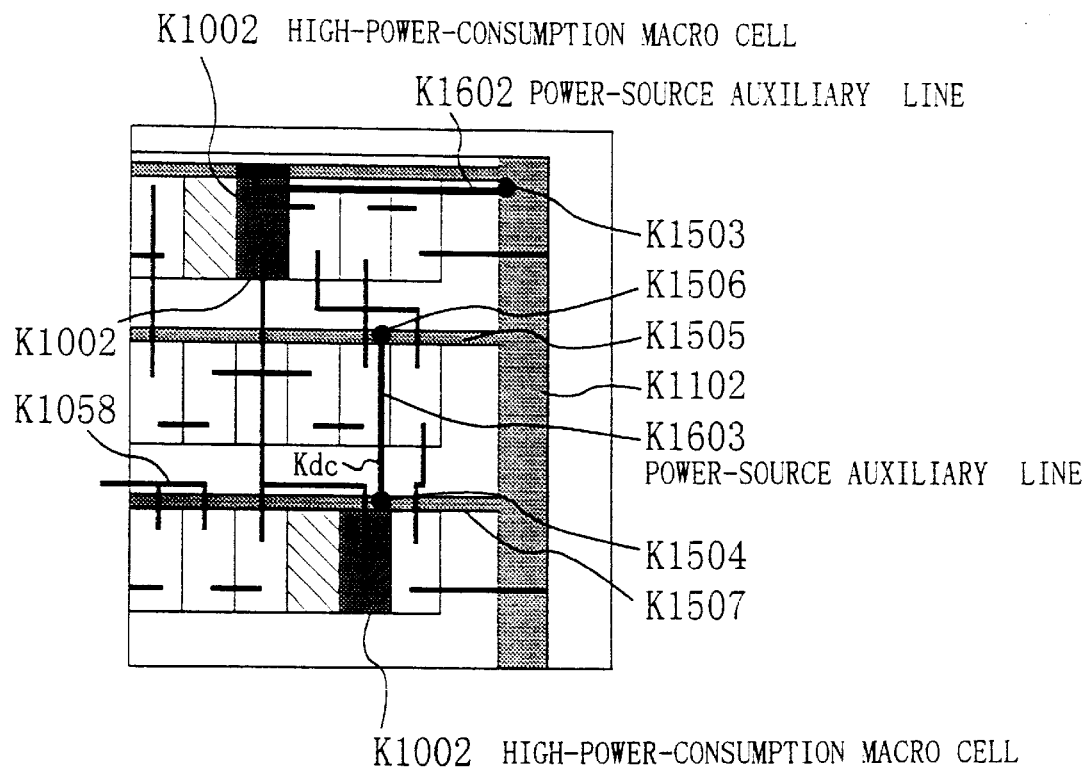
FIG. 37 shows the result of wiring with the auxiliary power-source lines.

In Step K403, there is performed the process of wiring the point of the power-source terminal K1502 to the connecting point K1503 on the basic power-source line K1102 (power-source-auxiliary-line routing step). The result of the process is shown in FIG. 37. In FIG. 37, a power-source auxiliary line used for wiring the two connecting points is designated at K1602.

Figure 36:
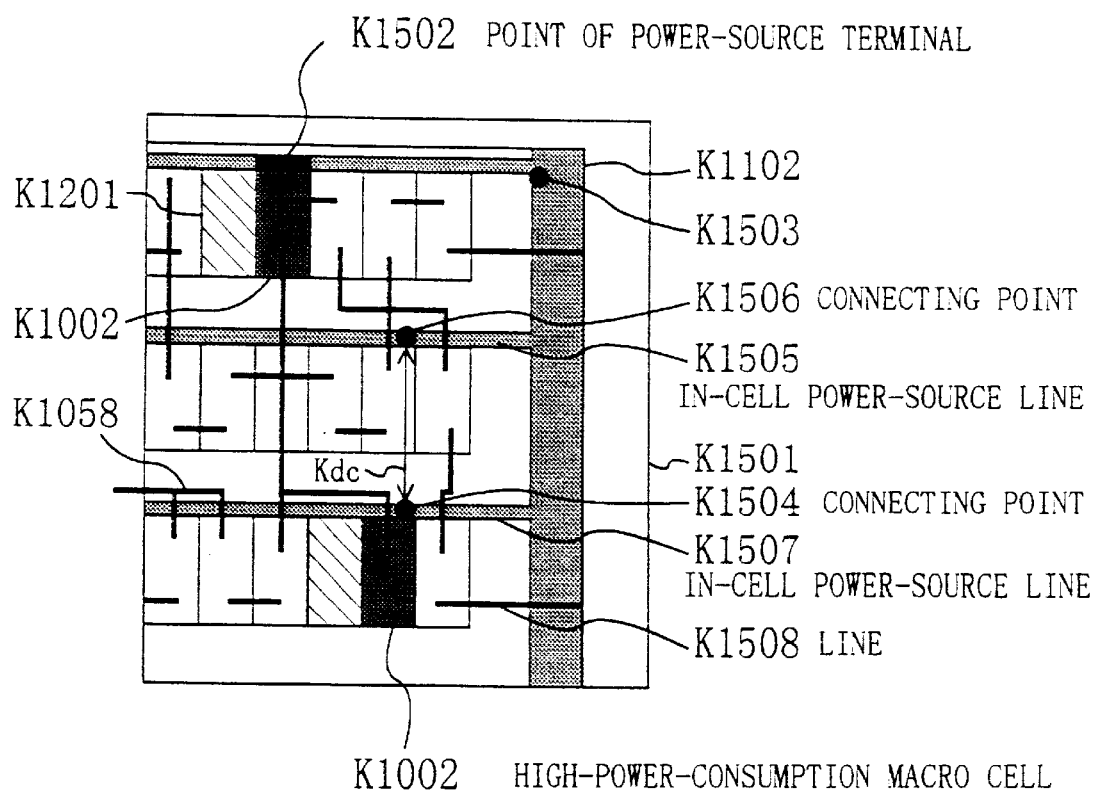
FIG. 36 shows the result of another placement of the macro cells.

In Step K501 shown in FIG. 27, there is performed the process of retrieving a connecting point on the in-cell power-source line supplying power to the high-power-consumption macro cell which is located in the vicinity of the high-power-consumption macro cell (connecting-point retrieving step). As shown in FIG. 36, the position at which the high-power-consumption macro cell K1002 is placed is retrieved and the connecting point K1504 on the in-cell power-source line K1507 supplying power to the high-power-consumption macro cell K1002 which is located in the vicinity of the high-power-consumption macro cell K1002 is obtained.

In Step K502, there is performed the process (another-connecting-point retrieving step) of retrieving a connecting point on another in-cell power-source line not supplying power to the high-power-consumption macro cells which is located in the vicinity of the high-power-consumption macro cell. As shown in FIG. 36, the process is for retrieving the in-cell power-source line not supplying power to the high-power-consumption macro cells K1002 from the macro-cell placement/routing result 1501, calculating the distance Kdc between the retrieved connecting point and the connecting point K1504 retrieved in Step K501, and calculating the connecting point K1506 on the in-cell power-source line K1505 which minimizes the distance Kdc.

In Step K503, there is performed the process of wiring the two connecting points K1504 and K1506 on the retrieved in-cell power-source lines (power-source-auxiliary-line routing step). In FIG. 37, a power-source auxiliary line K1603 used for wiring is designated at K1603.

By thus directly wiring the high-power-consumption macro cell K1502 to the basic power-source line K1101 or wiring the in-cell power-source lines K1505 and K1507 in Step K705 as shown in FIG. 37, a layout result for macro cells in which power is stably supplied is obtained.

Next, a description will be given to the flow of processes in the mask processing step K706 after placement and routing with reference to FIG. 28.

Figure 38:
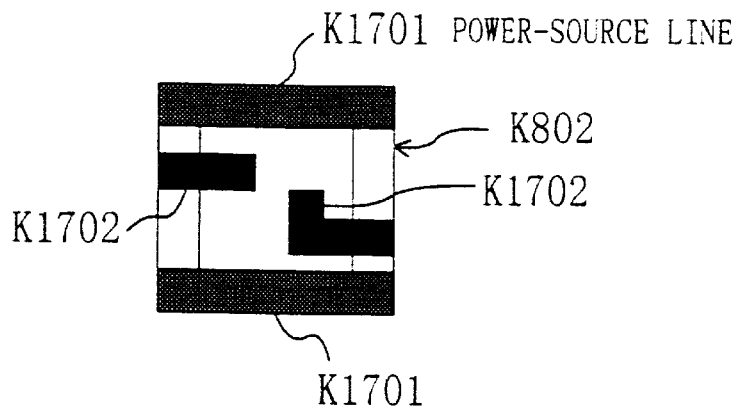
FIG. 38 is an enlarged view showing the result of the placement of the auxiliary power-source lines.

FIG. 38 shows an enlarged part of the macro cells K802 in a layout result K1001 for standard cells obtained by the foregoing process. In FIG. 38, the power-source lines of the macro cell K802 are designated at K1701 and wiring in a wiring layer containing the power-source lines K1701 is designated at K1702.

In Step K601 shown in FIG. 28, there is performed the process of extracting the configuration of power-source lines (power-source-line-configuration retrieving step). During the process, the power-source lines K1701 as shown in FIG. 38 are extracted.

In Step K602, there is performed the process of extracting the configuration of the inverted geometry of wiring K1702 in a wiring layer containing the power-source lines K1701 (inverted-geometry generating step). In the process, the geometries of the wiring and power-source lines K1701 contained in the same wiring layer are sequentially subjected to a mask OR operation and to a geometry inverting process to provide the inverted geometry K1801 shown in FIG. 39.

Figure 39:
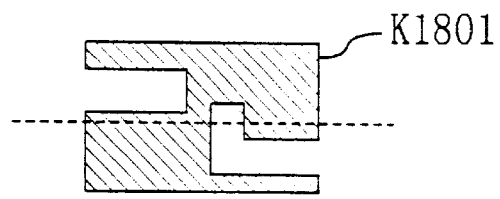
FIG. 39 shows an inverted geometry of wiring.
Figure 40:
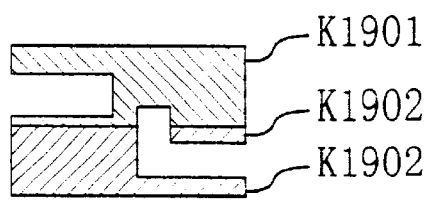
FIG. 40 shows the halved inverted geometry.

In Step K603, there is performed the process of halving the inverted geometry K1801 shown in FIG. 39 (dividing step). In the process, the inverted geometry K1801 is halved transversely to provide the post-division geometries K1901 and K1902.

Figure 41:
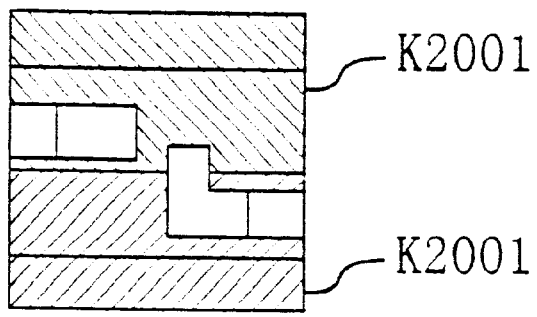
FIG. 41 shows power-source lines with the halved inverted geometry added thereto.

In Step K604, there is performed the process of adding the region of the wiring layer except for the wiring K1702 to the power-source-line configuration K1701 by a mask processing operation (mask operation step). The region obtained from an OR operation performed with respect to the two post-division geometries K1901 and K1902 and the power-source-line configuration is subjected to the process of a mask operation to provide the power-source-line configuration K2001 including the additional region of the wiring layer except for the wiring K1702, as shown in FIG. 41.

Figure 42:
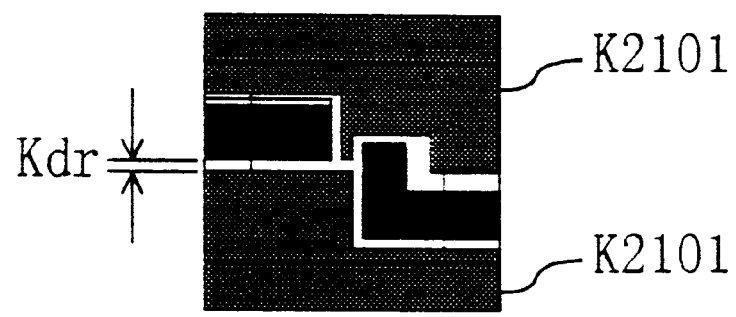
FIG. 42 shows a geometry obtained by reducing the power-source lines with the halved inverted geometry added thereto.

In Step K605, there is performed the process of reducing the power-source-line configuration K2001 by the magnitude of the predetermined minimum wire spacing Kdr (power-source-line reducing step). As shown in FIG. 42, the power-source-line configuration K2101 is obtained by reducing the power-source-line configuration K2002 by the magnitude of the predetermined minimum wire spacing Kdr in the mask operation process.

Since the power-source line is thickened to a maximum allowable degree compliant with the predetermined minimum wire spacing Kdr in Step K605, the power-source line itself functions as a capacitor, resulting in a stable power supply.

By thus sequentially performing the initial placement in which the high-power-consumption macro cells have been paired with the charge-accumulating cells, the improved placement in consideration of the positions at which the basic power-source lines are to be placed, the wiring with the power-source auxiliary lines, and the thickening of the power-source lines for achieving a stable power supply, a stable power supply is achieved to enable the layout design of a logic circuit less susceptible to a misoperation resulting from a voltage drop.

We claim:

1. An automatic layout method for a plurality of semiconductor macro cells using a computer, comprising a clustering step of placing the plurality of macro cells comprising:

a high-power-cell retrieving step of retrieving, from said plurality of macro cells, ones each consuming high power; and a pairing step of adding a charge-accumulating cell to each of the high-power-consumption macro cells retrieved in said retrieving step to pair each of the high-power-consumption macro cells with one charge-accumulating cell.

2. An automatic layout method for a plurality of semiconductor macro cells according to claim 1, wherein said charge-accumulating cell comprises a power-source line and a ground line, each shaped like a comb, said power-source line and said ground line being combined with each other with their teeth alternately arranged such that a specified minimum wire spacing is provided between the alternating teeth.

3. An automatic layout method for a plurality of semiconductor macro cells according to claim 1, further comprising a placement step of placing said pairs of high-power-consumption macro cells and charge-accumulating cells formed in said pairing step such that a maximum allowable spacing is provided between said individual pairs.

4. An automatic layout method for a plurality of semiconductor macro cells according to claim 1, further comprising:

a position specifying step of specifying a position at which a basic power-source line is to be placed; and a placement step of placing each pair of high-power-consumption macro cell and charge-accumulating cell formed in said pairing step at a reduced distance from the basic power-source line the position of which has been specified in said position specifying step.

5. An automatic layout method for a plurality of semiconductor macro cells according to claim 1, further comprising:

a position specifying step of specifying a position at which a basic power-source line is to be placed;

a power-source-terminal-point retrieving step of retrieving a point of a power-source terminal of each of said high-power-consumption macro cells;

a connecting-point retrieving step of retrieving such a connecting point on said basic power-source line as to minimize a distance between the point of the power-source terminal of said high-power-consumption macro cell and said basic power-source line; and a power-source-auxiliary-line routing step of wiring the point of the power-source terminal of said high-power-consumption macro cell to the connecting point on said basic power-source line with a power-source auxiliary line.

6. An automatic layout method for a plurality of semiconductor macro cells according to claim 1, further comprising a power-source-auxiliary-line routing step of wiring an in-cell power-source line supplying power to any of the high-power-consumption macro cells retrieved in said high-power-cell retrieving step and another in-cell power-source line not supplying power to said high-power-consumption macro cells with a power-source auxiliary line.

7. An automatic layout method for a plurality of semiconductor macro cells using a computer, comprising a macro-cell placing step of placing the plurality of macro cells comprising:

a high-power-cell retrieving step of retrieving, from the plurality of macro cells, ones each consuming high power; and a placement step of placing said plurality of high-power-consumption macro cells retrieved in said high-power-cell retrieving step such that a maximum allowable spacing is provided between said individual high-power-consumption macro cells.

8. An automatic layout method for a plurality of semiconductor macro cells according to claim 7, wherein said placement step comprises:

an evaluation-function calculating step of calculating a placement evaluation function using an area, a wire length, and a signal propagation time as factors;

an another-evaluation-function calculating step of calculating another placement evaluation function by adding a reciprocal of a distance between said individual high-power-consumption macro cells to said placement evaluation function; and a placement improving step of minimizing said another placement evaluation function.

9. An automatic layout method for a plurality of semiconductor macro cells using a computer, comprising a macro-cell placing step of placing the plurality of macro cells comprising:

a high-power-cell retrieving step of retrieving, from the plurality of macro cells, ones each consuming high power;

a position specifying step of specifying a position at which a basic power-source line is to be placed;

a placement step of placing each of said plurality of high-power-consumption macro cells retrieved in said high-power-cell retrieving step at a reduced distance from the basic power-source line the position of which has been specified in said position specifying step.

10. An automatic layout method for a plurality of semiconductor macro cells according to claim 9, wherein said placement step comprises:

an evaluation-function calculating step of calculating a placement evaluation function using an area, a wire length, and a signal propagation time as factors;

an another-evaluation-function calculating step of calculating another placement evaluation function by adding the distance between each of said high-power-consumption macro cells and said basic power-source line to said placement evaluation function; and a placement improving step of minimizing said another placement evaluation function.

11. An automatic layout method for a plurality of semiconductor macro cells using a computer, comprising a macro-cell placing step of placing the plurality of macro cells comprising:

a high-power-cell retrieving step of retrieving, from the plurality of macro cells, ones each consuming high power;

a position specifying step of specifying a position at which a basic power-source line is to be placed;

a power-source-terminal-point retrieving step of retrieving a point of a power-source terminal of each of said high-power-consumption macro cells;

a connecting-point retrieving step of retrieving such a connecting point on said basic power-source line as to minimize a distance between the point of the power-source terminal of said high-power-consumption macro cell and said basic power-source line; and a power-source-auxiliary-line routing step of wiring the point of the power-source terminal of said high-power-consumption macro cell to the connecting point on said basic power-source line with a power-source auxiliary line.

12. An automatic layout method for a plurality of semiconductor macro cells using a computer, comprising a macro-cell placing step of placing the plurality of macro cells comprising:

a high-power-cell retrieving step of retrieving, from the plurality of macro cells, ones each consuming high power; and a power-source-auxiliary-line routing step of wiring an in-cell power-source line supplying power to any of the high-power-consumption macro cells retrieved in said high-power-cell retrieving step and another in-cell power-source line not supplying power to said high-power-consumption macro cells with a power-source auxiliary line.

13. An automatic layout method for a plurality of semiconductor macro cells according to claim 12, wherein said power-source-auxiliary-line routing step comprises:

a connecting-point retrieving step of retrieving a connecting point on the in-cell power-source line supplying power to any of said high-power-consumption macro cells, said connecting point being located in the vicinity of said high-power-consumption macro cell;

another connecting-point retrieving step of retrieving another connecting point on the other in-cell power-source line located in the vicinity of said in-cell power-source line and not supplying power to said high-power-consumption macro cells, said other connecting point being located in the vicinity of said high-power-consumption macro cell; and a wiring step of wiring the two retrieved connecting points with the power-source auxiliary line.

14. A semiconductor macro cell comprising a wiring layer containing power-source lines, wherein said power-source lines and wiring other than the power-source lines are disposed in said wiring layer, said power-source lines being placed over an entire region at a distance equivalent to a specified minimum wire spacing from said wiring.

* * * * *